(12) United States Patent
Jeong et al.

(10) Patent No.: US 12,650,640 B2
(45) Date of Patent: *Jun. 9, 2026

(54) BLANK MASK AND PHOTOMASK USING THE SAME

(71) Applicant: LuminaMask Co., Ltd., Cheonan-si (KR)

(72) Inventors: Min Gyo Jeong, Seoul (KR); Sung Hoon Son, Seoul (KR); Seong Yoon Kim, Seoul (KR); GeonGon Lee, Seoul (KR); Suk Young Choi, Seoul (KR); Hyung-joo Lee, Seoul (KR); Hahyeon Cho, Seoul (KR); Taewan Kim, Seoul (KR); Suhyeon Kim, Seoul (KR); Inkyun Shin, Seoul (KR)

(73) Assignee: LuminaMask Co., Ltd., Cheonan-si (KR)

( * ) Notice: Subject to any disclaimer, the term of this patent is extended or adjusted under 35 U.S.C. 154(b) by 327 days.

This patent is subject to a terminal disclaimer.

(21) Appl. No.: 17/980,840

(22) Filed: Nov. 4, 2022

(65) Prior Publication Data

US 2023/0135037 A1 May 4, 2023

(30) Foreign Application Priority Data

Nov. 4, 2021 (KR) ......................... 10-2021-0150395

(51) Int. Cl.
| | |
|---|---|
| *G03F 1/32* | (2012.01) |
| *G03F 1/52* | (2012.01) |
| *G03F 1/58* | (2012.01) |

(52) U.S. Cl.
CPC .................. *G03F 1/32* (2013.01); *G03F 1/52* (2013.01); *G03F 1/58* (2013.01)

(58) Field of Classification Search
None
See application file for complete search history.

(56) References Cited

U.S. PATENT DOCUMENTS

| | | | | |
|---|---|---|---|---|
| 5,700,605 A | * | 12/1997 | Ito | ............................. G03F 1/30 |
| | | | | 430/323 |
| 2007/0020534 A1 | * | 1/2007 | Yoshikawa | ............... G03F 1/54 |
| | | | | 428/428 |

(Continued)

FOREIGN PATENT DOCUMENTS

| | | | | |
|---|---|---|---|---|
| CN | 109755108 A | | 5/2019 | |
| JP | 2001305713 A | * | 11/2001 | ............... G03F 1/46 |

(Continued)

*Primary Examiner* — Martin J Angebranndt
(74) *Attorney, Agent, or Firm* — NSIP Law

(57) ABSTRACT

The blank mask according to one embodiment of the present disclosure comprises a transparent substrate and a multilayer light shielding film disposed on the transparent substrate. The multilayer light shielding film comprises a transition metal and at least any one between oxygen and nitrogen. The multilayer light shielding film comprises a first light shielding film and a second light shielding film disposed on the first light shielding film. The multilayer light shielding film comprises total nine parts that are formed by trisection in a width direction and a length direction of an upper surface of the multilayer light shielding film. Each part of the multilayer light shielding film comprises a measuring range disposed in a side thereof. The measuring range is corresponded to a range between a point distant from an upper boundary of the first light shielding film to a lower boundary of the first light shielding film and a point distant from a lower boundary of the second light shielding film to an upper boundary of the second light shielding film, in respective sides of the parts of the multilayer light shielding film. The multilayer light shielding film has dR (difference value of roughness) values of Equation 1 below respectively measured from the total nine parts of the multilayer light shielding film, and an average value of dR values of the Equation 1 is 3 nm or less.

$$dR=Rac-Rbc \qquad \text{[Equation 1]}$$

(Continued)

100

10

The Rac is a surface roughness [unit: nm] measured from the measuring range of the part of the multilayer light shielding film, after the part of the multilayer light shielding film are soaked for 800 seconds in SC-1 (Standard Clean-1) solution and rinsed by ozone water.

The Rbc is a surface roughness [unit: nm] measured from the measuring range of the part of the multilayer light shielding film before the part of the multilayer light shielding film are soaked in the SC-1 solution.

The SC-1 solution is a solution comprising $NH_4OH$ of 14.3 wt %, $H_2O_2$ of 14.3 wt %, and $H_2O$ of 71.4 wt %.

The ozone water is a solution comprising ozone in an amount of 20 ppm (by weight) with ultrapure water as a solvent.

In such a case, during an enhanced cleaning, the multilayer light shielding film can have excellent durability against a cleaning solution in all the areas thereof.

9 Claims, 3 Drawing Sheets

(56)     References Cited

U.S. PATENT DOCUMENTS

| | | | | |
|---|---|---|---|---|
| 2015/0268552 A1* | 9/2015 | Nam | G03F 1/26 | |
| | | | 430/5 | |
| 2016/0291451 A1* | 10/2016 | Nam | G03F 1/58 | |
| 2017/0139316 A1* | 5/2017 | Shishido | G03F 1/32 | |
| 2017/0168384 A1 | 6/2017 | Shishido et al. | | |
| 2018/0297321 A1 | 10/2018 | Jin et al. | | |
| 2020/0379338 A1* | 12/2020 | Shishido | G03F 1/54 | |
| 2022/0350237 A1* | 11/2022 | Jeong | G03F 1/32 | |
| 2023/0135120 A1* | 5/2023 | Son | G03F 1/82 | |
| | | | 430/5 | |
| 2023/0350237 A1* | 11/2023 | Kim | C09K 11/70 | |

FOREIGN PATENT DOCUMENTS

| | | | | | |
|---|---|---|---|---|---|
| JP | 2015-191218 A | | 11/2015 | | |
| JP | 2016105158 A | * | 6/2016 | ............... | G03F 1/46 |
| JP | 2016188997 A | * | 11/2016 | ............... | G03F 1/08 |
| JP | 2017-49475 A | | 3/2017 | | |
| JP | 2017-151427 A | | 8/2017 | | |
| JP | 2018005102 A | * | 1/2018 | | |
| JP | 2018106023 A | * | 7/2018 | ............... | G03F 1/26 |
| JP | 2018116263 A | * | 7/2018 | ............... | G03F 1/26 |
| JP | 6479058 B2 | | 3/2019 | | |
| JP | 2020-74053 A | | 5/2020 | | |
| JP | 2021152574 A | * | 9/2021 | ............... | G03F 1/26 |
| JP | 2022-171560 A | | 11/2022 | | |
| KR | 10-2008-0093443 A | | 10/2008 | | |
| KR | 10-2009-0016210 A | | 2/2009 | | |
| KR | 10-2009-0047320 A | | 5/2009 | | |
| KR | 10-2010-0127864 A | | 12/2010 | | |
| KR | 10-2010-0134074 A | | 12/2010 | | |
| KR | 10-2011-0016739 A | | 2/2011 | | |
| KR | 10-2011-0044123 A | | 4/2011 | | |
| KR | 10-1197250 B1 | | 11/2012 | | |
| KR | 10-2013-0132925 A | | 12/2013 | | |
| KR | 2014027636 A | * | 3/2014 | ............... | G03F 1/38 |
| KR | 10-1471354 B1 | | 12/2014 | | |
| KR | 10-2016-0105931 A | | 9/2016 | | |
| KR | 10-2016-0135374 A | | 11/2016 | | |
| KR | 10-2016-0138247 A | | 12/2016 | | |
| KR | 10-2020-0066178 A | | 6/2020 | | |
| KR | 10-2020-0137938 A | | 12/2020 | | |
| TW | 201907224 A | | 2/2019 | | |
| TW | 201921637 A | | 6/2019 | | |
| TW | 201923441 A | | 6/2019 | | |
| TW | 201928093 A | | 7/2019 | | |
| TW | 201937267 A | | 9/2019 | | |

* cited by examiner

BLANK MASK AND PHOTOMASK USING THE SAME

CROSS-REFERENCE TO RELATED APPLICATIONS

This application claims the benefit under 35 U.S.C. 119(a) of Korean Patent Application No. 10-2021-0150395 filed on Nov. 4, 2021 in the Korean Intellectual Property Office, the entire disclosure of which is incorporated herein by reference for all purposes.

BACKGROUND

1. Field

The present disclosure relates to a blank mask, a photomask using the same, and the like.

2. Description of Related Art

Due to high integration of semiconductor devices or the like, miniaturization of circuit patterns of semiconductor devices is being required. For this reason, the importance of a lithography technique, which is a technique for developing a circuit pattern on a wafer surface using a photomask is being emphasized further.

For developing a miniaturized circuit pattern, a light source of exposure used in an exposure process (photolithography) is required to have a short wavelength. As the light source of exposure used recently, there is argon fluoride (ArF) excimer laser (wavelength of 193 nm) or the like.

Incidentally, there are Binary mask, Phase shift mask, and the like as photomasks.

The Binary mask has a structure in which a light shielding layer pattern has been formed on a transparent substrate. In a surface where a pattern has been formed within the Binary mask, a transmissive portion not including a light shielding layer allows exposure light to be transmitted, and a light shielding portion including a light shielding layer blocks exposure light, to transfer a pattern on a resist film of the surface of a wafer. However, the Binary mask may cause a problem in the development of a minute pattern due to diffraction of light occurring at the edge of the transmissive portion as the pattern becomes more miniatured.

As a phase shift mask, there are Levenson type, Outrigger type, and Half-tone type. Among the above, Half-tone type phase shift mask has a structure in which a pattern formed with semi-transmissive films is formed on a transparent substrate. In a surface where a pattern has been formed within the Half-tone type phase shift mask, a transmissive portion not including a semi-transmissive layer allows exposure light to be transmitted, and a semi-transmissive portion including a semi-transmissive layer allows attenuated exposure light to be transmitted. The attenuated exposure light is allowed to have a phase difference compared to exposure light which has entered the transmissive portion. Accordingly, diffraction light occurring at the edge of the transmissive portion is counteracted by the exposure light which has transmitted the semi-transmissive portion, and thereby the phase shift mask can form a further refined minute pattern on the surface of a wafer.

SUMMARY

In one general aspect, a blank mask according to one embodiment of the present application includes a transparent substrate and a multilayer light shielding film disposed on the transparent substrate.

The multilayer light shielding film includes a transition metal and at least one between oxygen and nitrogen.

The multilayer light shielding film includes a first light shielding film and a second light shielding film disposed on the first light shielding film.

The multilayer light shielding film includes total nine parts of the multilayer light shielding film that are formed by trisection in a width direction and a length direction of an upper surface of the multilayer light shielding film.

Each part of the multilayer light shielding film includes a measuring range disposed on a side thereof.

The measuring range is corresponded to a range between a point distant from an upper boundary of the first light shielding film to a lower boundary of the first light shielding film and a point distant from a lower boundary of the second light shielding film to an upper boundary of the second light shielding film.

The multilayer light shielding film has dR (difference value of roughness) values of Equation 1 below respectively measured from the total nine parts of the multilayer light shielding film, and an average value of the dR values of the Equation 1 is 3 nm or less.

$$dR=Rac-Rbc \qquad \text{[Equation 1]}$$

The Rac is a surface roughness [unit: nm] measured from the measuring range of the part of the multilayer light shielding film, after the part of the multilayer light shielding film is soaked for 800 seconds in SC-1 (Standard Clean-1) solution and rinsed by ozone water.

The Rbc is a surface roughness [unit: nm] measured from the measuring range of the part of the multilayer light shielding before the part of the multilayer light shielding film is soaked in SC-1 solution.

The SC-1 solution is a solution including $NH_4OH$ of 14.3 wt %, $H_2O_2$ of 14.3 wt %, and $H_2O$ of 71.4 wt %.

The ozone water is a solution including ozone in an amount of 20 ppm (by weight) with ultrapure water as a solvent.

A standard deviation of dR values respectively measured from the total nine parts of the multilayer light shielding film may be 0.5 nm or less.

An interface may be disposed between the upper boundary of the first light shielding film and the lower surface of the second light shielding film.

The measuring range may be corresponded to a range between a point distant by 5 nm from the interface to the lower boundary of the first light shielding film and a point distant by 5 nm from the interface to the upper boundary of the second light shielding film.

The second light shielding film may include an upper light shielding layer and an adhesion enhancing layer disposed between the upper light shielding layer and the first light shielding film.

The adhesion enhancing layer may have a thickness of 12 Å to 30 Å.

An absolute value of a value of subtracting an amount of a transition metal of the adhesion enhancing layer from an amount of a transition metal of the upper light shielding layer may be 10 at % or less.

An absolute value of a value of subtracting an amount of a transition metal of the first light shielding film from an amount of a transition metal of the adhesion enhancing layer may be 35 at % or less.

An absolute value of a value of subtracting a nitrogen amount of the adhesion enhancing layer from a nitrogen amount of the upper light shielding layer may be 10 at % or less.

An absolute value of a value of subtracting a nitrogen amount of the first light shielding film from a nitrogen amount of the adhesion enhancing layer may be 25 at % or less.

An upper surface of the adhesion enhancing layer immediately after forming may include total nine sectors that are formed by trisection in a width direction and a length direction of an upper surface of the adhesion enhancing layer.

The adhesion enhancing layer may have Rku (kurtosis) values respectively measured from the total nine sectors of the adhesion enhancing layer, and an average value of the Rku (kurtosis) value may be 3.5 or more.

A standard deviation of the Rku (kurtosis) value respectively measured from the total nine sectors of the adhesion enhancing layer may be 2 or less.

The transition metal may include at least any one among Cr, Ta, Ti and Hf.

A photomask according to another embodiment of the present application includes a transparent substrate and a multilayer light shielding pattern film disposed on the transparent substrate.

The multilayer light shielding pattern film includes a transition metal and at least any one between oxygen and nitrogen.

The multilayer light shielding pattern film includes total nine parts of the multilayer light shielding pattern film that are formed by trisection in a width direction and a length direction of an upper surface of the transparent substrate.

Each part of the multilayer light shielding pattern film includes a measuring range disposed in a side thereof.

The measuring range is corresponded to a range between a point distant from an upper boundary of the first light shielding film to a lower boundary of the first light shielding film and a point distant from a lower boundary of the second light shielding film to an upper boundary of the second light shielding film.

The multilayer light shielding pattern film has pdR (difference value of roughness for a photomask) values of Equation 2 below respectively measured from the total nine parts of the multilayer light shielding pattern film, and an average value of the pdR values of the Equation 2 is 3 nm or less.

$$pdR = pRac - pRbc \qquad \text{[Equation 2]}$$

The pRac is a surface roughness [unit: nm] measured from the measuring range after the multilayer light shielding pattern film is soaked for 800 second in SC-1 (Standard Clean-1) solution and rinsed by ozone water.

The pRbc is a surface roughness [unit: nm] measured from the measuring range before the multilayer light shielding pattern film is soaked in the SC-1 solution.

The SC-1 solution is a solution comprising $NH_4OH$ of 14.3 wt %, $H_2O_2$ of 14.3 wt %, and $H_2O$ of 71.4 wt %.

The ozone water is a solution comprising ozone in an amount of 20 ppm (by weight) with ultrapure water as a solvent.

A manufacturing method of a semiconductor element according to another embodiment includes a preparation of disposing a light source, a photomask, and a semiconductor wafer where a resist film have been applied; an exposure operation of selectively transmitting a light incident from the light source to the semiconductor wafer through the photomask to be transferred; and a development operation of developing a pattern on the semiconductor wafer.

The photomask includes a transparent substrate and a multilayer light shielding pattern film disposed on the transparent substrate.

The multilayer light shielding pattern film includes a transition metal, and at least any one between oxygen and nitrogen.

The multilayer light shielding pattern film includes a first light shielding film and a second light shielding film disposed on the first light shielding film.

The multilayer light shielding pattern film includes total nine parts that are formed by trisection in a width direction and a length direction of an upper surface of the transparent substrate.

Each part of the multilayer light shielding pattern film includes a measuring range disposed in a side thereof.

The measuring range is corresponded to a range between a point distant from an upper boundary of the first light shielding film to a lower boundary of the first light shielding film and a point distant from a lower boundary of the second light shielding film to an upper boundary of the second light shielding film.

The multilayer light shielding pattern film has pdR (difference value of roughness for a photomask) values of Equation 2 below respectively measured from the total nine parts of the multilayer light shielding pattern film, and an average value of the pdR values of the Equation 2 is 3 nm or less.

$$pdR = pRac - pRbc \qquad \text{[Equation 2]}$$

The pRac is a surface roughness [unit: nm] measured from the measuring range after the multilayer light shielding pattern film is soaked for 800 second in SC-1 (Standard Clean-1) solution and rinsed by ozone water.

The pRbc is a surface roughness [unit: nm] measured from the measuring range before the multilayer light shielding pattern film is soaked in the SC-1 solution.

The SC-1 solution is a solution comprising $NH_4OH$ of 14.3 wt %, $H_2O_2$ of 14.3 wt %, and $H_2O$ of 71.4 wt %.

The ozone water is a solution comprising ozone in an amount of 20 ppm (by weight) with ultrapure water as a solvent.

DETAILED DESCRIPTION

Figure 1:
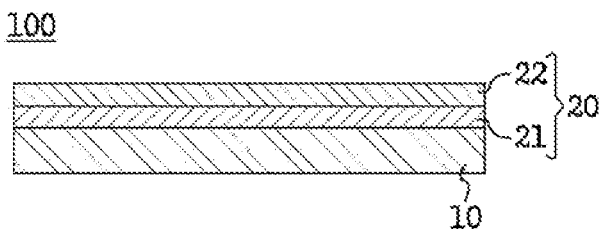
FIG. 1 is a conceptual view for illustrating a blank mask according to one embodiment disclosed in the present application.

Hereinafter, example embodiments of the present disclosure will be described in detail with reference to the accompanying drawings so that they can be easily practiced by those skilled in the art to which the present invention pertains. However, the example embodiments may be embodied in many different forms and is not to be construed as being limited to the embodiments set forth herein.

In this application, the term for degree like "about", "substantially" and the like is used for meaning values approximative from/to the value when a tolerance to be proper to referred meaning for manufacture and substance is presented. Additionally, these terms for degree are used to help understanding of example embodiments and to prevent that an unconscionable trespasser unjustly uses the presented content in which exact or absolute number is referred.

Throughout this application, the phrase "combination(s) thereof" included in a Markush-type expression denotes one or more mixtures or combinations selected from the group consisting of components stated in the Markush-type expression, that is, denotes one or more components selected from the group consisting of the components are included.

Throughout this application, the description of "A and/or B" means "A, B, or A and B."

Throughout this application, terms such as "first", "second", "A", or "B" are used to distinguish the same terms from each other unless specially stated otherwise.

In this application, "B being placed on A" means that B is placed in direct contact with A or placed over A with another layer or structure interposed therebetween and thus should not be interpreted as being limited to B being placed in direct contact with A.

In this application, a singular form is contextually interpreted as including a plural form as well as a singular form unless specially stated otherwise.

In this application, the surface profile means the outline shape observed at the surface.

A peak is a portion placed in the upper portion of a reference line (means an average height line of the surface profile) from the surface profile of a light shielding film.

A valley is a portion placed in the lower portion of a reference line from the surface profile of a light shielding film.

Rku value is a value evaluated in accordance with ISO_4287. Rku value refers to kurtosis of the surface profile of a measuring target. Rku value is a dimensionless number, and a value without a unit.

Ry value is a value evaluated in accordance with ISO_4287. Ry value is the sum of the maximum height value of a peak and the maximum depth value of a valley of the surface profile of a measuring target.

In the present application, the room temperature refers to a temperature of 20° C. to 25° C.

In the present application, the standard deviation refers to a sample standard deviation.

Due to high integration of a semiconductor device, forming a further miniaturized circuit pattern on a semiconductor wafer is on demand. As Critical Dimension (CD) of a pattern developed on a semiconductor wafer is further decreased, the critical dimension of the pattern is required to be controlled as a further elaborate scale.

A cleaning process may be performed to a light shielding film, or a light shielding pattern film formed by patterning of the light shielding film. As a cleaning process, there are an normal cleaning method which is performed in order to remove organic matters and other foreign matters absorbed on the surface of the light shielding film, and an enhanced cleaning method which is performed in order to adjust the critical dimension of a light shielding pattern film within a photomask. The enhanced cleaning method may use a cleaning solution whose oxidation force is relatively high or be performed for a long time.

Incidentally, in consideration of etching characteristics, optical properties, and the like, the light shielding film may be formed in a multilayer structure of two layers or more. The light shielding film in a multilayer structure may cause damage in the side surface of the light shielding film contacting with a cleaning solution, and particularly around the interface between layers within the side surface, when cleaning is performed according to the enhanced cleaning method. Because of the above, the inventors applied a light shielding film in a multilayer structure in which roughness difference measured from a side of each light shielding film part is decreased between before and after operation of the enhanced cleaning, ascertained that such a problem can be addressed, and completed the present disclosure.

Hereinafter, the present disclosure will be described in detail.

FIG. 1 is a conceptual view for illustrating a blank mask according to one embodiment disclosed in the present application. With reference to the FIG. 1, the blank mask of the present disclosure is described.

A blank mask 100 comprises a transparent substrate 10 and a multilayer light shielding film 20 disposed on the transparent substrate 10.

Any material having a light transmitting characteristic with respect to an exposure light and applicable to a blank mask 100 may be applied as the material of the transparent substrate 10 without limitation. Specifically, the transparent substrate 10 may have a transmittance of 85% or more with respect to an exposure light with the wavelength of 193 nm. The transmittance may be 87% or more. The transmittance may be 99.99% or less. For example, the transparent substrate 10 may be a synthetic quartz substrate. In such a case, the transparent substrate 10 can suppress attenuation of a light transmitting the transparent substrate 10.

Additionally, the transparent substrate 10 can suppress the occurrence of optical distortion by adjusting the surface characteristics such as flatness and roughness.

A multilayer light shielding film 20 may be disposed on a upper surface of the transparent substrate 10.

The multilayer light shielding film 20 may have a characteristic of at least partially blocking an exposure light incident to the lower surface of the transparent substrate 10. In addition, when a phase shift film 30 (refer to FIG. 6) or the like is placed between the transparent substrate 10 and the multilayer light shielding film 20, the multilayer light shielding film 20 may be used as an etching mask in a process of etching the phase shift film 30 to be a pattern shape.

The blank mask has a three-dimensional shape comprising a lower surface and an upper surface facing each other, and sides. The lower surface is a surface of a side where the transparent substrate 10 is disposed within the blank mask. The upper surface is a surface of a side where a thin film such as the multilayer light shielding film is disposed within the blank mask. The sides of the blank mask comprise the sides of the transparent substrate 10 and the multilayer light shielding film 20.

The multilayer light shielding film 20 comprises a transition metal and at least any one between oxygen and nitrogen.

The multilayer light shielding film 20 may comprise a first light shielding film 21 and a second light shielding film 22 disposed on the first light shielding film 21.

The first light shielding film 21 and the second light shielding film 22 have a transition metal in different amounts from each other.

Durability of Light Shielding Film Against Cleaning Solution

The multilayer light shielding film 20 comprises total nine parts of the multilayer light shielding film that are formed by trisection in a width direction and a length direction of an upper surface of the multilayer light shielding film.

Each part of the multilayer light shielding film comprises a measuring range disposed on the side thereof.

The measuring range is corresponded to a range between a point distant from an upper boundary of the first light shielding film 21 to a lower boundary of the first light shielding film 21 and a point distant from a lower boundary of the second light shielding film 22 to an upper boundary of the second light shielding film 22.

The multilayer light shielding film has dR (difference value of roughness) values of Equation 1 below respectively measured from the total nine parts of the multilayer light shielding film, and an average value of the dR values of the Equation 1 is 3 nm or less.

$$dR=Rac-Rbc \qquad \text{[Equation 1]}$$

The Rac is a surface roughness [unit: nm] measured from the measuring range of the parts of the multilayer light shielding film, after the parts of the multilayer light shielding film is soaked for 800 seconds in SC-1 (Standard Clean-1) solution and rinsed by ozone water.

The Rbc is a surface roughness [unit: nm] measured from the measuring range of the parts of the multilayer light shielding before the parts of the multilayer light shielding film is soaked in SC-1 solution.

The SC-1 solution is a solution comprising $NH_4OH$ of 14.3 wt %, $H_2O_2$ of 14.3 wt %, and $H_2O$ of 71.4 wt %.

The ozone water is a solution comprising ozone in an amount of 20 ppm (by weight) with ultrapure water as a solvent.

In the light shielding film having a multilayer structure, each layer comprised in the light shielding film may have a considerable difference in the properties compared to an adjacent layer. Due to the above, a sufficient adhesive force may not be formed in the interface between layers.

During the process of performing the enhanced cleaning, in the area relatively weak in the mechanical properties within the surface of the light shielding film contacting with a cleaning solution, damage of some parts constituting the light shielding film may occur. Particularly, when the light shielding film has a multilayer structure, the possibility of causing damage in the vicinity of the interface between layers may be relatively high within the side surface of the light shielding film.

The present disclosure applies a multilayer light shielding film in which difference values of the surface roughness measured from the side surface of each part of multilayer light shielding film before and after the enhanced cleaning, and thereby allows the light shielding film to have stable durability overall, even though the enhanced cleaning is performed at the multilayer light shielding film.

Figure 2:
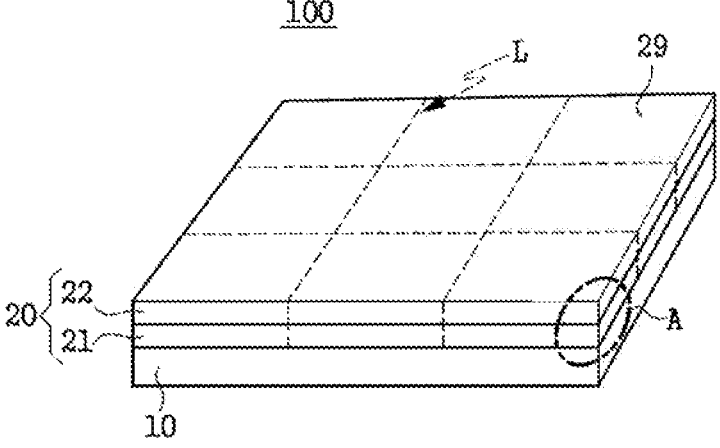
FIG. 2 is a conceptual view for illustrating a part of a multilayer light shielding film.

FIG. 2 is a conceptual view for illustrating a part of a multilayer light shielding film. With reference to the FIG. 2, the blank mask of the present disclosure is described.

The multilayer light shielding film 20 has a three-dimensional shape comprising a lower surface and a upper surface facing each other, and sides. The lower surface is the surface of a side where the transparent substrate 10 is disposed within the multilayer light shielding film 20. The upper surface is the surface of a side opposite to the lower surface within the multilayer light shielding film 20.

The multilayer light shielding film 20 comprises total nine parts of the multilayer light shielding film 29 that are formed by trisection in a width direction and a length direction for the multilayer light shielding film 20. The parts of the multilayer light shielding film 29 are distinguished by a virtual dividing line (L) which trisects the multilayer light shielding film 20 in the width and length directions.

The parts of the multilayer light shielding film 29 have a three-dimensional shape comprising a lower surface and a upper surface facing each other, and sides. The lower surface is a surface of a side where the transparent substrate 10 is disposed within the parts of the multilayer light shielding film 29. The upper surface is the surface of a side opposite to the lower surface within the parts of the multilayer light shielding film 29.

The side of the multilayer light shielding film 20 may comprise the side of the parts of the multilayer light shielding film 29. The side of the multilayer light shielding film 20 may be the same as the side of the parts of the multilayer light shielding film 29.

Figure 3:
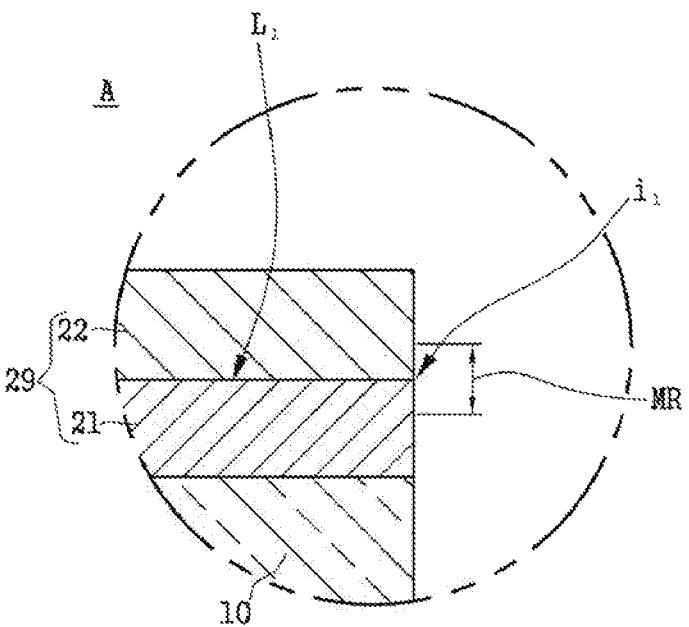
FIG. 3 is an enlarged view of the part expressed as "A" in FIG. 2.

FIG. 3 is an enlarged view of the part expressed as A in FIG. 2. With reference to the FIG. 3, the blank mask of the present disclosure is described.

A measuring range (MR) is corresponded to a range between a point distant from the upper boundary (corresponded to a upper surface) of the first light shielding film 21 to the lower boundary (corresponded to a lower surface) of the first light shielding film 21 and a point distant from the lower boundary (corresponded to a lower surface) of the second light shielding film 22 to the upper boundary (corresponded to a upper surface) of the second light shielding film 22, in the side of a part of the multilayer light shielding film 29.

In the part of the multilayer light shielding film 29 of the present disclosure, the first light shielding film 21 and the second light shielding film 22 may be disposed neighboring each other. In such a case, the measuring range (MR) is corresponded to a range between a point distant from the interface ($i_1$) between the first light shielding film 21 and the second light shielding film 22, to the lower boundary of the first light shielding film 21, and a point distant from the interface to the upper boundary of the second light shielding film 22, in the side of the part of the multilayer light shielding film 29.

The measuring range (MR) may be corresponded to a range between a point distant by 5 nm from the interface ($i_1$) to the lower boundary of the first light shielding film 21 and a point distant by 5 nm to the upper boundary of the second light shielding film 22. At this time, when the point distant by 5 nm from the interface ($i_1$) to the lower boundary of the first light shielding film 21 is out of the side of the part of the multilayer light shielding film 29, the portion to the lower boundary of the side of the part of the multilayer light shielding film 29 is specified as the measuring range (MR). Likewise, when the point distant by 5 nm from the interface ($i_1$) to the upper boundary of the second light shielding film 22 is out of the side of the part of the multilayer light shielding film 29, the portion to the upper boundary of the side of the part of the multilayer light shielding film 29 is specified as the measuring range (MR).

Figure 4:
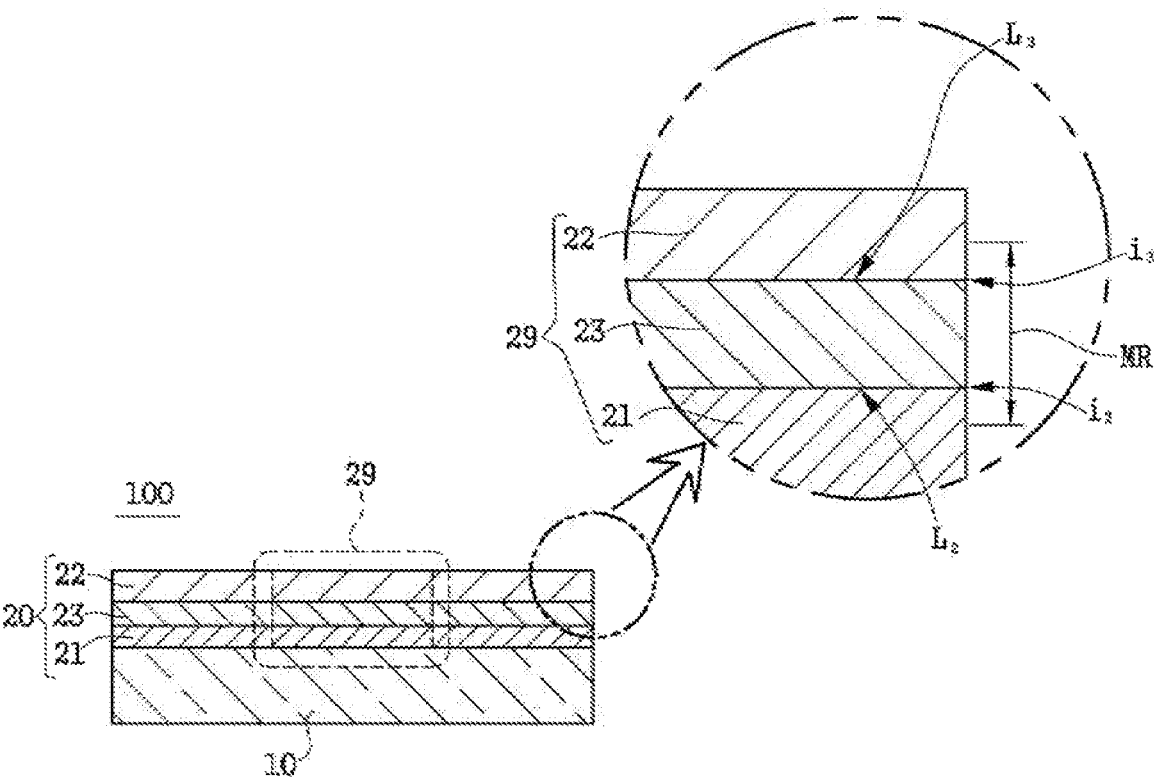
FIG. 4 is a conceptual view for illustrating a measuring range of a blank mask according to another embodiment of the present application.

FIG. 4 is a conceptual view for illustrating a measuring range (MR) in a blank mask according to another embodiment of the present application. With reference to the FIG. 4, the blank mask of the present disclosure is described.

The part of the multilayer light shielding film 29 of the present disclosure may have another thin film 23 disposed between the first light shielding film 21 and the second light shielding film 22.

The measuring range (MR) may be corresponded to a range between a point distant by 5 nm from the point at upper boundary within a side of the first light shielding film ($i_2$) to the lower boundary of the first light shielding film 21 and a point distant by 5 nm from the point at lower boundary within a side of the second light shielding film ($i_3$) to the upper boundary of the second light shielding film 22. At this time, when the point distant by 5 nm from the point at upper boundary within the first light shielding film ($i_2$) to the lower boundary of the first light shielding film 21 is out of the side of the part of the multilayer light shielding film 29, the portion to the lower boundary of the side of the part of the multilayer light shielding film is specified as the measuring range (MR). Likewise, when the point distant by 5 nm from the point at lower boundary within a side of the second light shielding film ($i_3$) to the upper surface of the second light shielding film 22 is out of the side of the side of the part of the multilayer light shielding film 29, the portion to the top line of the side of the part of the multilayer light shielding film 29 is specified as the measuring range (MR).

The multilayer light shielding film 20 has dR (difference value of roughness) values of the Equation 1 respectively measured from the total nine parts of the multilayer light shielding film 29. The average value of the dR values of the Equation 1 may be 3 nm or less.

In the light shielding film having a multilayer structure, each layer comprised in the light shielding film may have a considerable difference in the properties compared to an adjacent layer. Due to the above, an adhesion force in a sufficient strength may not be formed in the interface between layers.

During the process of performing enhanced cleaning, in the area relatively weak in the mechanical properties within the surface of the light shielding film contacting with a cleaning solution, damage of some parts constituting the light shielding film may occur. Particularly, when the enhanced cleaning is performed for the light shielding film in a multilayer structure, the possibility of causing damage in the vicinity of the interface between layers may be relatively high within the side surface of the light shielding film.

The present disclosure applies a multilayer light shielding film in which the average value of difference values in the surface roughness within a measuring range (MR) measured from the part of the multilayer light shielding film 29 has been controlled, and thereby allows the light shielding film to have stable durability in all the areas, even though the enhanced cleaning is performed.

A method of manufacturing a dR value of the part of the multilayer light shielding film 29 is the same as follows.

For convenience of the measurement of dR values, a blank mask is divided into three parts vertically and horizontally and total nine parts of the blank mask are formed. Each part of the blank mask comprises one part of the multilayer light shielding film 29. Subsequently, the part of the blank mask is cut into the size of 15 mm vertically and horizontally. The division and cutting of the part of the blank mask are performed by using of XY axial cutting machine. In detail, a blank mask sample as a measuring target is placed in a stage of the cutting machine and fixed by Stop bar. After the sample is fixed, in consideration of the position to be cut in the sample, a cutting wheel is moved and fixed. After the cutting wheel is fixed, the cutting wheel is moved in reciprocating motion at the speed of 0.15 m/s for the upper end of the sample and the sample is cut.

For example, the XY axial cutting machine may be applied by SPC-452 model available from KStar Co., Ltd.

After the part of the blank mask processed in this manner is treated by FIB (Focused Ion Beam), the sectional image of the part of the blank mask is measured through TEM (Transmission Electron Microscopy) measuring apparatus. The TEM measuring apparatus may be applied by JEM-2100F HR model available from JEOL LTD.

After elevating contrast rate of the sectional image of the part of the blank mask, the measuring range (MR) is specified from the image. A point distant by 5 nm from the upper boundary of the first light shielding film 21 to the lower boundary of the first light shielding film 21 and a point distant by 5 nm from the lower boundary of the second light shielding film 22 to the upper boundary of the second light shielding film 22 may be specified as the measuring range (MR).

Thereafter, the surface profile of the portion corresponding to the measuring range (MR) within the side of the part of the multilayer light shielding film 29 is traced from the image of the section of the part of the blank mask, and an Rbc value is calculated in accordance with the calculating method of Ry (maximum height roughness) standardized in ISO 4287 from the image of the traced line. The unit of the Rbc value is nm.

After the measurement of the Rbc value, the part of the blank mask processed in this manner is soaked for 800 seconds in SC-1 solution. After soaking, rinsing is performed for the part of the blank mask processed in this manner. Soaking in SC-1 solution and rinsing by ozone water are performed at a room temperature.

Thereafter, the same method as the method of measuring Rbc value is applied to measure Rac (roughness after cleaning) value.

A dR value presents the degree of being damaged in the in-plane direction of the blank mask when the side portion of the multilayer light shielding film 20 has been soaked after a cleaning process for a long time. That is, when a virtual line extended along to the side of the blank mask is defined as a reference line, the dR value exhibits the degree of being damaged to the inside direction of the reference line when the side portion of the multilayer light shielding film 20 has been soaked after a cleaning process for a long time.

By the same method as the above, dR value of each part of the multilayer light shielding film 29 is measured. One multilayer light shielding film 20 has total nine dR values respectively measured from total nine parts of the multilayer light shielding film 29.

The multilayer light shielding film 20 may have dR values respectively measured from total nine parts of the multilayer light shielding film 29, and the average value of the dR values may be 3 nm or less. The average value may be 2 nm or less. The average value may be 1.5 nm or less. The average value may be 1 nm or less. The average value may be 0 nm or more. The average value may be 0.5 nm or more. In such a case, damage of the light shielding film caused from the enhanced cleaning can be effectively decreased.

A standard deviation of dR values respectively measured from the total nine parts of the multilayer light shielding film may be 0.5 nm or less.

The adhesion force between layers comprised in the multilayer light shielding film 20 may have relatively uneven values in the in-plane direction. This is thought as caused from influence of sputtering process conditions such as the angle of a sputtering target and a substrate applied when the multilayer light shielding film 20 is formed and the distribution of an atmospheric gas in a chamber. This may cause a problem in that the multilayer light shielding film 20 obtains excellent chemical resistance overall.

The present disclosure controls the standard deviation of dR values respectively measured from the parts of the multilayer light shielding film 29, and thereby can make the adhesion force between layers comprised in the multilayer light shielding film 20 be more uniform in all the areas of the multilayer light shielding film 20.

The multilayer light shielding film 20 has dR values of Equation 1 respectively measured from the total nine parts of the multilayer light shielding film 29, and the standard deviation value of the dR values may be 0.5 nm or less. The standard deviation value may be 0.4 nm or less. The standard deviation value may be 0.35 nm or less. The standard deviation value may be 0 nm or more. The standard deviation value may be 0.1 nm or more. In such a case, it is possible to lower fluctuation of adhesion forces between layers by areas within the multilayer light shielding film 20.

Roughness Characteristic and Thickness of Adhesion Enhancing Layer

Figure 5:
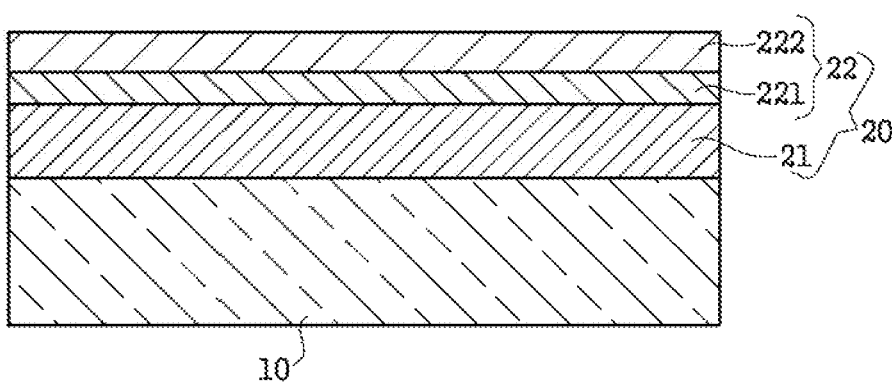
FIG. 5 is a conceptual view for illustrating a blank mask according to another embodiment of the present application.

FIG. 5 is a conceptual view for illustrating a blank mask according to another embodiment of the present application. With reference to the FIG. 5, the blank mask of the present disclosure is described.

The second light shielding film 22 may comprise an upper light shielding layer 222 and an adhesion enhancing layer disposed between the upper light shielding layer 222 and the first light shielding film 21.

The present disclosure applies an adhesion enhancing layer 221 to the second light shielding film 22, and thereby can enhance the adhesion force between the second light shielding film 22 and another thin film formed in contact with the bottom of the second light shielding film 22, particularly, the first light shielding film 21. In detail, by control of the difference in the composition between the adhesion enhancing layer 221 and another thin film formed in contact with the bottom of the adhesion enhancing layer 221, the chemical adhesion force between thin films can be enhanced. Besides, by applying the adhesion enhancing layer 221 controlled in the roughness characteristic on the first light shielding film 21, contact area of the adhesion enhancing layer 221 to another thin film laminated in contact with the top of the adhesion enhancing layer, particularly, an upper light shielding layer 222 can be increased and adhesion force can be enhanced.

The adhesion enhancing layer 221 may have a thickness of 12 Å to 30 Å.

In the process of forming the adhesion enhancing layer 221, sputtering particles may be sporadically deposited on the surface of a target to be formed into a film, and thereby allow the surface of the adhesion enhancing layer 221 to have a rough surface. However, when sputtering is sustained for a certain time or more, other sputtering particles may be deposited between the sputtering particles deposited sporadically, and the roughness of the surface of the adhesion enhancing layer 221 may be lowered than the roughness targeted in the present disclosure. The present disclosure may control the thickness of the adhesion enhancing layer 221 and allow the surface of the adhesion enhancing layer 221 to have a roughness characteristic suitable for improving the adhesion force between layers within the multilayer light shielding film 20.

The thickness of the adhesion enhancing layer 221 may be measured through TEM image measurement. The method of TEM image measurement may be the same as the method applied to the measurement of dR values described above.

The adhesion enhancing layer 221 may have a thickness of 12 Å to 30 Å. The thickness may be 13 Å or more. The thickness may be 25 Å or less. The thickness may be 20 Å or less. In such a case, it is possible to help improving adhesion force between a thin film contacted with the top side of the adhesion enhancing layer 221.

Immediately after the forming the adhesion enhancing layer 221, an upper surface of the adhesion enhancing layer 221 may comprise total nine sector that are formed by trisection in a width direction and a length direction for the upper surface of the adhesion enhancing layer 221.

The adhesion enhancing layer 221 may have Rku (kurtosis) values respectively measured from the total nine sectors of the adhesion enhancing layer, and the average value of the Rku values may be 3.5 or more.

The Rku value is a value evaluated in accordance with ISO_4287. Rku value refers to kurtosis of the surface profile of a measuring target. Rku value is a dimensionless number, and a value without a unit.

By control of the distribution of a kurtosis characteristic in the in-plane direction of the adhesion enhancing layer 221, it is possible to improve the mechanical adhesion force between the adhesion enhancing layer 221 and another thin film formed in contact with the top side of the adhesion enhancing layer 221, particularly, the upper light shielding layer 222. In detail, by control of the kurtosis of the top side of the adhesion enhancing layer 221, another thin film formed in contact with the top side of the adhesion enhancing layer 221, particularly, the bottom side of the upper light shielding layer 222 can be further strongly sticked to the top side of the adhesion enhancing layer 221.

However, when the kurtosis value of the top side of the adhesion enhancing layer 221 has an excessively high value, it was ascertained that a peak located in the top side of the adhesion might be relatively easily broken by external impact. In consideration of such a characteristic, the present disclosure can control the distribution of a kurtosis characteristic in the in-plane direction of the top side of the adhesion enhancing layer 221 immediately after forming. Through the above, it is possible to improve mechanical adhesion force between the top side of the adhesion enhancing layer 221 and a thin film formed on the top side of the adhesion enhancing layer 221, and it is also possible to decrease the amount of particles causable in the process of sputtering to the upper surface of the adhesion enhancing layer 221.

A method of measuring an Rku value of the sector of the adhesion enhancing layer is the same as below.

The Rku value is measured from the area of 20 μm vertically and horizontally located in the center of the surface of the sector of the adhesion enhancing layer. By using a two-dimensional roughness meter and setting the scan speed to be 0.5 Hz for the area, measurement of the Rku value is made in Non-contact mode. For example, the Rku value may be measured by application of XE-150 model available from Park System applied with PPP-NCHR which is Cantilever model available from Park System. From the Rku values measured by sectors of the adhesion enhancing layer, the average value and the standard deviation value of the Rku values can be calculated.

Immediately after the forming the adhesion enhancing layer 221, the upper surface of the adhesion enhancing layer 221 may comprise total nine sectors that are formed by trisection in a width direction and a length direction, the adhesion enhancing layer 221 may have Rku values respectively measured from the total nine adhesion enhancing layer, and the average value of the Rku values may be 3.5 or more. The average value may be 6 or more. The average value may be 6.5 or more. The average value may be 7 or more. The average value may be 20 or less. The average value may be 15 or less. The average value may be 10 or less. The average value may be 9 or less. In such a case, the mechanical adhesion force between the adhesion enhancing layer 221 and another thin film formed in contact with the top side of the adhesion enhancing layer 221 can be improved further. Also, occurrence of defects causable from particles in the process of forming the other thin film can be suppressed.

The adhesion enhancing layer 221 may have Rku values respectively measured from the total nine sectors of the adhesion enhancing layer, and the standard deviation value may be 2 or less. The standard deviation value may be 1.6 or less. The standard deviation value may be 1 or less. The standard deviation value may be 0 or more. The standard deviation value may be 0.5 or more. In such a case, all the areas of the multilayer light shielding film 20 can present relatively uniform durability.

Composition of Adhesion Enhancing Layer

By controlling the difference in the composition between the adhesion enhancing layer 221 and the upper light shielding layer 222 and the difference in the composition between the adhesion enhancing layer 221 and the first light shielding film 21, the durability of the multilayer light shielding film 20 against a cleaning solution can be improved further.

In detail, by control of the difference in the composition between the adhesion enhancing layer 221 and the upper light shielding layer 222, particularly, the difference in the amount of a transition metal, it is possible to adjust the difference in the properties such as a surface energy between the adhesion enhancing layer 221 and the upper light shielding layer 222. Through the above, it is possible to form a further excellent adhesion force between the adhesion enhancing layer 221 and the upper light shielding layer 222 by improvement of bond between elements of the surface of the adhesion enhancing layer 221 and elements of the surface of the upper light shielding film. In the same way, by control of the difference in the amount of a transition metal, and the like, between the adhesion enhancing layer 221 and the first light shielding film 21, it is possible to form excellent adhesion force between the adhesion enhancing layer 221 and the first light shielding film 21. As a result, it is possible to form a multilayer light shielding film having further excellent durability against a cleaning solution compared to a multilayer light shielding film not applied with the adhesion enhancing layer 221.

The amounts by elements of the upper light shielding layer 222, the adhesion enhancing layer 221, and the first light shielding film 21 may be measured through depth profile using XPS (X-ray Photoelectron Spectroscopy). In detail, the blank mask is cut into the size of 15 mm vertically and horizontally to prepare a sample. Thereafter, the sample is disposed in XPS measuring apparatus, and an area having the width of 4 mm and the length of 2 mm located in the center of the sample is etched for measurement of the amount of a transition metal of each thin film.

For example, the amounts by elements of each thin film may be measured by K-alpha model available from Thermo Scientific.

The value of subtracting the amount of a transition metal of the adhesion enhancing layer 221 from the amount of a transition metal of the upper light shielding layer 222 may have an absolute value of 10 at % or less. The absolute value may be 8 at % or less. The absolute value may be 5 at % or less. The absolute value may be 0 at % or more.

The value of subtracting the nitrogen amount of the adhesion enhancing layer 221 from the nitrogen amount of the upper light shielding layer 222 may have an absolute value of 10 at % or less. The absolute value may be 8 at % or less. The absolute value may be 5 at % or less. The absolute value may be 0 at % or more.

The value of subtracting the oxygen amount of the adhesion enhancing layer 221 from the oxygen amount of the upper light shielding layer 222 may have an absolute value of 10 at % or less. The absolute value may be 8 at % or less. The absolute value may be 5 at % or less. The absolute value may be 0 at % or more.

In such a case, a strong adhesion force may be formed in the interface where the upper light shielding layer 222 and the adhesion enhancing layer 221 meet.

The value of subtracting the amount of a transition metal of the first light shielding film 21 from the amount of a transition metal of the adhesion enhancing layer 221 may be 35 at % or less. The absolute value may be 30 at % or less. The absolute value may be 15 at % or more. The absolute value may be 20 at % or more.

The value of subtracting the nitrogen amount of the first light shielding film 21 from the nitrogen amount of the adhesion enhancing layer 221 may be 25 at % or less. The absolute value may be 20 at % or less. The absolute value may be 15 at % or less. The absolute value may be 5 at % or more.

The value of subtracting the oxygen amount of the first light shielding film 21 from the oxygen amount of the adhesion enhancing layer 221 may be 35 at % or less. The absolute value may be 30 at % or less. The absolute value may be 15 at % or more. The absolute value may be 20 at % or more.

In such a case, the multilayer light shielding film 20 can exhibit stable durability in a cleaning process for a long time even though comprising two or more light shielding films (or light shielding layers) having a difference in the amount of a transition metal of a certain level or more.

The amount of a transition metal of the adhesion enhancing layer 221 may be higher than the amount of a transition metal of the first light shielding film 21. The amount of a transition metal of the adhesion enhancing layer 221 may be lower than or the same as the amount of a transition metal of the upper light shielding layer 222.

In the present disclosure, the amount of a transition metal of the adhesion enhancing layer 221 may affect the kurtosis characteristic of the surface of the adhesion enhancing layer 221. In detail, when the adhesion enhancing layer 221 was formed, the tendency that the amount of an reactant gas was lower, the roughness value of the surface of the formed adhesion enhancing layer 22 was higher was ascertained. In the present disclosure, the amount of a transition metal of the adhesion enhancing layer 221 is controlled within the range predetermined in the present disclosure, and thereby the mechanical adhesion force between the adhesion enhancing layer 221 and a thin film formed in contact with the top of the adhesion enhancing layer 221 can be improved. Additionally, by adjusting the difference in the surface energy between the adhesion enhancing layer 221 and a thin film adjacent to the adhesion enhancing layer 221, the present disclosure can improve durability of the multilayer light shielding film 20 further.

The adhesion enhancing layer 221 may comprise a transition metal, oxygen, and nitrogen. The adhesion enhancing layer may comprise a transition metal in an amount of 35 at % or more. The adhesion enhancing layer may comprise a transition metal in an amount of 40 at % or more. The adhesion enhancing layer may comprise a transition metal in an amount of 45 at % or more. The adhesion enhancing layer may comprise a transition metal in an amount of 55 at % or more. The adhesion enhancing layer may comprise a transition metal in an amount of 82 at % or less. The adhesion enhancing layer may comprise a transition metal in an amount of 70 at % or less.

The sum of the oxygen amount and the nitrogen amount of the adhesion enhancing layer may be 15 at % or more. The value may be 20 at % or more. The value may be 25 at % or more. The value may be 55 at % or less. The value may be 50 at % or less. The value may be 45 at % or less. The value may be 35 at % or less.

The adhesion enhancing layer 221 may comprise oxygen in an amount of 5 at % or more. The adhesion enhancing layer 221 may comprise oxygen in an amount of 7 at % or more. The adhesion enhancing layer 221 may comprise oxygen in an amount of 25 at % or less. The adhesion enhancing layer 221 may comprise oxygen in an amount of 15 at % or less.

The adhesion enhancing layer 221 may comprise nitrogen in an amount of 10 at % or more. The adhesion enhancing layer 221 may comprise nitrogen in an amount of 15 at % or more. The adhesion enhancing layer 221 may comprise nitrogen in an amount of 30 at % or less. The adhesion enhancing layer 221 may comprise nitrogen in an amount of 25 at % or less.

The adhesion enhancing layer 221 may comprise carbon in an amount of 1 at % or more. The adhesion enhancing layer 221 may comprise carbon in an amount of 15 at % or less. The adhesion enhancing layer 221 may comprise carbon in an amount of 10 at % or less. The adhesion enhancing layer 221 may comprise carbon in an amount of 5 at % or less.

In such a case, the kurtosis characteristic of the adhesion enhancing layer 221 is adjusted and it can help improving of the durability of the multilayer light shielding film 20, and can decrease the difference in the surface energy between the adhesion enhancing layer 221 and a thin film (particularly, the upper light shielding layer 222 or the first light shielding film) formed in contact with the adhesion enhancing layer 221.

Composition and Thickness of Multilayer Light Shielding Film

The multilayer light shielding film 20 may be patterned through dry etching. During the process of dry etching, the upper portion of the multilayer light shielding film 20 may be exposed for a relatively long time compared to the lower portion thereof. Due to the above, difficulty may occur in that the multilayer light shielding pattern film has a predesigned shape.

The present disclosure may control composition, a thickness, a process condition during sputtering, and the like of a thin film comprised in the multilayer light shielding film 20, in consideration of the optical properties required in the multilayer light shielding film 20, the shape of the multilayer light shielding pattern film formed through patterning, and the like.

The first light shielding film 21 may comprise a transition metal, oxygen, and nitrogen. The first light shielding film 21 may comprise a transition metal in an amount of 25 at % or more. The first light shielding layer 21 may comprise a transition metal in an amount of 30 at % or more. The first light shielding layer 21 may comprise a transition metal in an amount of 55 at % or less. The first light shielding layer 21 may comprise a transition metal in an amount of 50 at % or less. The first light shielding layer 21 may comprise a transition metal in an amount of 45 at % or less.

The sum of the oxygen amount and the nitrogen amount of the first light shielding film 21 may be 22 at % or more. The sum of the oxygen amount and the nitrogen amount of the first light shielding layer 21 may be 30 at % or more. The sum of the oxygen amount and the nitrogen amount of the first light shielding layer 21 may be 40 at % or more. The sum of the oxygen amount and the nitrogen amount of the first light shielding layer 21 may be 70 at % or less. The sum of the oxygen amount and the nitrogen amount of the first light shielding layer 21 may be 60 at % or less. The sum of the oxygen amount and the nitrogen amount of the first light shielding layer 21 may be 50 at % or less.

The first light shielding layer 21 may comprise oxygen in an amount of 20 at % or more. The first light shielding layer 21 may comprise oxygen in an amount of 25 at % or more. The first light shielding layer 21 may comprise oxygen in an amount of 30 at % or more. The first light shielding layer 21 may comprise oxygen in an amount of 50 at % or less. The first light shielding layer 21 may comprise oxygen in an amount of 45 at % or less. The first light shielding layer 21 may comprise oxygen in an amount of 40 at % or less.

The first light shielding layer 21 may comprise nitrogen in an amount of 2 at % or more. The first light shielding layer 21 may comprise nitrogen in an amount of 5 at % or more. The first light shielding layer 21 may comprise nitrogen in an amount of 20 at % or less. The first light shielding layer 21 may comprise nitrogen in an amount of 15 at % or less.

The first light shielding layer 21 may comprise carbon in an amount of 5 at % or more. The first light shielding layer 21 may comprise carbon in an amount of 10 at % or more. The first light shielding layer 21 may comprise carbon in an amount of 25 at % or less. The first light shielding layer 21 may comprise carbon in an amount of 20 at % or less.

In such a case, the first light shielding layer 21 can help the light shielding film 20 to have an excellent extinction characteristic.

The second light shielding film 22 may comprise a transition metal, and oxygen or nitrogen. The second light shielding film 22 may comprise a transition metal in an amount of 35 at % or more. The second light shielding film 22 may comprise a transition metal in an amount of 40 at % or more. The second light shielding film 22 may comprise a transition metal in an amount of 45 at % or more. The second light shielding film 22 may comprise a transition metal in an amount of 55 at % or more. The second light shielding film 22 may comprise a transition metal in an amount of 82 at % or less. The second light shielding film 22 may comprise a transition metal in an amount of 70 at % or less.

The sum of the oxygen amount and the nitrogen amount of the second light shielding film 22 may be 15 at % or more. The value may be 20 at % or more. The value may be 25 at % or more. The value may be 55 at % or less. The value may be 50 at % or less. The value may be 45 at % or less. The value may be 35 at % or less.

The second light shielding film 22 may comprise oxygen in an amount of 5 at % or more. The second light shielding film 22 may comprise oxygen in an amount of 7 at % or more. The second light shielding film 22 may comprise oxygen in an amount of 25 at % or less. The second light shielding film 22 may comprise oxygen in an amount of 15 at % or less.

The second light shielding film 22 may comprise nitrogen in an amount of 10 at % or more. The second light shielding film 22 may comprise nitrogen in an amount of 15 at % or more. The second light shielding film 22 may comprise nitrogen in an amount of 30 at % or less. The second light shielding film 22 may comprise nitrogen in an amount of 25 at % or less.

The second light shielding film 22 may comprise carbon in an amount of 1 at % or more. The second light shielding film 22 may comprise carbon in an amount of 15 at % or less. The second light shielding film 22 may comprise carbon in an amount of 10 at % or less. The second light shielding film 22 may comprise carbon in an amount of 5 at % or less.

The upper light shielding layer 222 may comprise a transition metal and oxygen or nitrogen. The upper light shielding layer 222 may comprise a transition metal in an amount of 35 at % or more. The upper light shielding layer 222 may comprise a transition metal in an amount of 40 at % or more. The upper light shielding layer 222 may comprise a transition metal in an amount of 45 at % or more. The upper light shielding layer 222 may comprise a transition metal in an amount of 55 at % or more. The upper light shielding layer 222 may comprise a transition metal in an amount of 82 at % or less. The upper light shielding layer 222 may comprise a transition metal in an amount of 70 at % or less.

The sum of the oxygen amount and the nitrogen amount of the upper light shielding layer 222 may be 15 at % or more. The value may be 20 at % or more. The value may be 25 at % or more. The value may be 55 at % or less. The value may be 50 at % or less. The value may be 45 at % or less. The value may be 35 at % or less.

The upper light shielding layer 222 may comprise oxygen in an amount of 5 at % or more. The upper light shielding layer 222 may comprise oxygen in an amount of 7 at % or more. The upper light shielding layer 222 may comprise oxygen in an amount of 25 at % or less. The upper light shielding layer 222 may comprise oxygen in an amount of 20 at % or less. The upper light shielding layer 222 may comprise oxygen in an amount of 15 at % or less.

The upper light shielding layer 222 may comprise nitrogen in an amount of 10 at % or more. The upper light shielding layer 222 may comprise nitrogen in an amount of 15 at % or more. The upper light shielding layer 222 may comprise nitrogen in an amount of 30 at % or less. The upper light shielding layer 222 may comprise nitrogen in an amount of 25 at % or less.

The upper light shielding layer 222 may comprise carbon in an amount of 1 at % or more. The upper light shielding layer 222 may comprise carbon in an amount of 15 at % or less. The upper light shielding layer 222 may comprise carbon in an amount of 10 at % or less. The upper light shielding layer 222 may comprise carbon in an amount of 5 at % or less.

In such a case, it is possible to help the multilayer light shielding film 20 to have optical properties suitable for a defect test, in addition to having an excellent extinction characteristic. Additionally, it is possible to help the multilayer light shielding pattern film formed from the multilayer light shielding film 20 to be formed in the predesigned shape.

The value of subtracting the amount of a transition metal of the first light shielding film 21 from the amount of a transition metal of the upper light shielding layer 222 may have an absolute value of 35 at % or less. The absolute value may be 30 at % or less. The absolute value may be 15 at % or more. The absolute value may be 20 at % or more.

The value of subtracting the nitrogen amount of the first light shielding film 21 from the nitrogen amount of the upper light shielding layer 222 may have an absolute value of 25 at % or less. The absolute value may be 20 at % or less. The absolute value may be 15 at % or less. The absolute value may be 5 at % or more.

The value of subtracting the oxygen amount of the first light shielding film 21 from the oxygen amount of the upper light shielding layer 222 may have an absolute value of 35 at % or less. The absolute value may be 30 at % or less. The absolute value may be 15 at % or more. The absolute value may be 20 at % or more.

In such a case, it is possible to increase the effect of increasing an adhesion force by the adhesion enhancing layer 221.

The transition metal may comprise at least any one among Cr, Ta, Ti, and Hf. The transition metal may be Cr.

The first light shielding film 21 may have a thickness of 250 to 650 Å. The first light shielding film 21 may have a thickness of 350 to 600 Å. The first light shielding film 21 may have a thickness of 400 to 550 Å.

In such a case, it is possible to help the first light shielding film to have an excellent extinction characteristic.

The second light shielding film 22 may have a thickness of 30 to 200 Å. The second light shielding film 22 may have a thickness of 30 to 100 Å. The second light shielding film 22 may have a thickness of 40 to 80 Å.

The upper light shielding film 22 may have a thickness of 30 to 200 Å. The upper light shielding film 22 may have a thickness of 30 to 100 Å. The upper light shielding film 22 may have a thickness of 40 to 80 Å.

In such a case, the multilayer light shielding film 20 can be further elaborately patterned and thereby the resolution of a photomask can be improved further.

The ratio of the thickness of the second light shielding film 22 to the thickness of the first light shielding film 21 may be a value of 0.05 to 0.3. The thickness ratio may be a value of 0.07 to 0.25. The thickness ratio may be a value of 0.1 to 0.2. In such a case, the side shape of the multilayer light shielding pattern film formed through patterning can be further elaborately controlled.

The ratio of the thickness of the adhesion enhancing layer to the thickness of the first light shielding film 21 may be a value of 0.005 to 0.05. The thickness ratio may be a value of 0.01 to 0.04. The thickness ratio may be a value of 0.015 to 0.03. In such a case, the multilayer light shielding film 20 can have stable durability against a cleaning solution.

Optical Properties of Multilayer Light Shielding Film

The multilayer light shielding film 20 may have an optical density of 1.8 or more with respect to a light with the wavelength of 193 nm. The multilayer light shielding film 20 may have an optical density of 1.9 or more with respect to a light with the wavelength of 193 nm.

The multilayer light shielding film 20 may have a transmittance of 1.5% or less with respect to a light with the wavelength of 193 nm. The multilayer light shielding film 20 may have a transmittance of 1.4% or less with respect to a light with the wavelength of 193 nm. The multilayer light shielding film 20 may have a transmittance of 1.2% or less with respect to a light with the wavelength of 193 nm.

In such a case, the multilayer light shielding film 20 can help blocking the transmission of an exposure light effectively.

The optical density and transmittance of the multilayer light shielding film 20 may be measured by use of a spectroscopic ellipsometer. For example, the optical density and transmittance of the multilayer light shielding film 20 may be measured by use of MG-Pro model available from Nano-View Co., Ltd.

Other Thin Film

Figure 6:
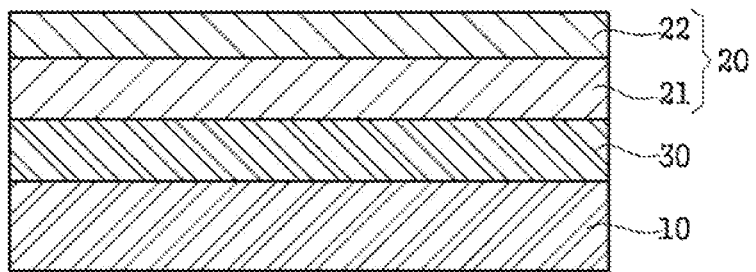
FIG. 6 is a conceptual view for illustrating a blank mask according to another embodiment of the present application.

FIG. 6 is a conceptual view for illustrating a blank mask according to another embodiment of the present application. With reference to the FIG. 6, the description below is made.

A phase shift film 30 may be disposed between a transparent substrate 10 and a multilayer light shielding film 20. The phase shift film 30 is a thin film for attenuating a light intensity of an exposure light transmitting the phase shift film 30 and substantially suppressing a diffraction light occurring at the edge of a transcribed pattern by adjusting the phase difference of an exposure light.

The phase shift film 30 may have a phase difference of 170 to 190° with respect to a light with the wavelength of 193 nm. The phase shift film 30 may have a phase difference of 175 to 185° with respect to a light with the wavelength of 193 nm.

The phase shift film 30 may have a transmittance of 3 to 10% with respect to a light with the wavelength of 193 nm. The phase shift film 30 may have a transmittance of 4 to 8% with respect to a light with the wavelength of 193 nm.

In such a case, it is possible to suppress a diffraction light causable at the edge of a pattern film effectively.

A thin film comprising the phase shift film 30 and the multilayer light shielding film 20 may have an optical density of 3 or more with respect to a light with the wavelength of 193 nm. A thin film comprising the phase shift film 30 and the multilayer light shielding film 20 may have an optical density of 3.2 or more with respect to a light with the wavelength of 193 nm. In such a case, the thin film can effectively suppress the transmission of an exposure light.

The phase difference and the transmittance of the phase shift film 30 and the optical density of a thin film comprising the phase shift film 30 and the multilayer light shielding film 20 may be measured by use of a spectroscopic ellipsometer. For example, MG-Pro model available from Nano-View Co., Ltd may be used as the spectroscopic ellipsometer.

The phase shift film 30 may comprise a transition metal and silicon. The phase shift film 30 may comprise a transition metal, silicon, oxygen, and nitrogen. The transition metal may be molybdenum.

A hard mask (not shown) may be disposed on the multilayer light shielding film 20. The hard mask may function as an etching mask film when a pattern of the light shielding film 20 is etched. The hard mask may comprise silicon, nitrogen, and oxygen.

Photomask

Figure 7:
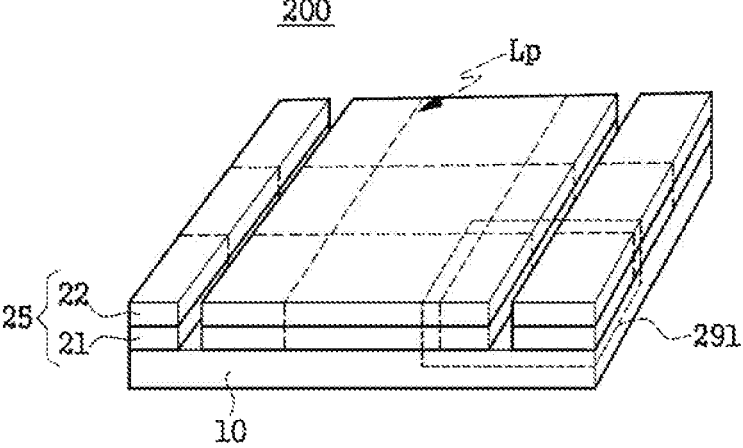
FIG. 7 is a conceptual view for illustrating a photomask according to another embodiment of the present application.

FIG. 7 is a conceptual view for illustrating a photomask according to another embodiment of the present application. With reference to the FIG. 7, the present disclosure is described.

A photomask 200 according to another embodiment of the present application comprises a transparent substrate 10 and a multilayer light shielding pattern film 25 disposed on the transparent substrate 10.

The multilayer light shielding pattern film 25 may comprise a transition metal and at least any one between oxygen and nitrogen.

The multilayer light shielding pattern film 25 may comprise a first light shielding film 21 and a second light shielding film 22 disposed on the first light shielding film 21.

The multilayer light shielding pattern film 25 may comprise total nine parts 291 of the multilayer light shielding pattern film that are formed by trisection in a width direction and a length direction of an upper surface of the transparent substrate 10.

Each part of the multilayer light shielding pattern film 291 comprises a measuring range located in the side surface.

The measuring range is corresponded to a range between a point distant from an upper boundary of the first light shielding film 21 to a lower boundary of the first light shielding film 21 and a point distant from a lower boundary of the second light shielding film 22 to a upper boundary of the second light shielding film 22.

The multilayer light shielding pattern film has pdR (difference value of roughness for a photomask) values of Equation 2 below respectively measured from the total nine parts of the multilayer light shielding pattern film, and an average value of the pdR values of Equation 2 is 3 nm or less.

$$pdR = pRac - pRbc \qquad \text{[Equation 2]}$$

The pRac is a surface roughness [unit: nm] measured from the measuring range after the multilayer light shielding pattern film 25 is soaked for 800 second in SC-1 (Standard Clean-1) solution and rinsed by ozone water.

The pRbc is a surface roughness [unit: nm] measured from the measuring range before the multilayer light shielding pattern film 25 is soaked in the SC-1 solution.

The SC-1 solution is a solution comprising $NH_4OH$ of 14.3 wt %, $H_2O_2$ of 14.3 wt %, and $H_2O$ of 71.4 wt %.

The ozone water is a solution comprising ozone in an amount of 20 ppm (by weight) with ultrapure water as a solvent.

A method of measuring the pdR value of Equation 2 from the part of the multilayer light shielding pattern film 291 is the same as the method of measuring the dR value of the part of the multilayer light shielding film 29. However, instead of that the parts of the blank mask are formed by division of the blank mask for measurement, the photomask 200 is divided, and the side surface of each part of the multilayer light shielding pattern film is applied as a measuring target instead of the side surface of each part of the multilayer light shielding film 29.

The multilayer light shielding pattern film 25 may be formed by patterning of the multilayer light shielding film 20 described in the above.

The description of the layer structure, properties, composition, and the like of the multilayer light shielding pattern film 25 is overlapped with the above description of the light shielding film and thus omitted.

Manufacturing Method of Multilayer Light Shielding Film

A manufacturing method of a blank mask according to one embodiment of the present application comprises a preparation of disposing a sputtering target comprising a transition metal and a transparent substrate in a sputtering chamber; a first light shielding film formation operation for forming a first light shielding film on the transparent substrate; and a second light shielding film formation operation for forming a second light shielding film on the first light shielding film.

The second light shielding film formation operation comprises an adhesion enhancing layer formation process for forming an adhesion enhancing layer on the first light shielding film; and an upper light shielding layer formation process for forming an upper light shielding layer on the formed adhesion enhancing layer.

In the preparation, the sputtering chamber may comprise an internal space in which a sputtering target and a transparent substrate may be disposed. The sputtering chamber may comprise an inlet for an atmospheric gas equipped in the bottom of the internal space. When an atmospheric gas is injected to the internal space through the inlet, the fluctuation in the properties and composition in the in-plane direction of the thin film to be formed can be relatively decreased.

In the preparation, a target may be selected in consideration of the composition of the light shielding film when the light shielding film is formed. The sputtering target may be applied by one target containing a transition metal. The sputtering target may be applied by two or more targets comprising one target containing a transition metal. The target containing a transition metal may comprise the transition metal in an amount of 90 at % or more. The target containing a transition metal may comprise the transition metal in an amount of 95 at % or more. The target containing a transition metal may comprise the transition metal in an amount of 99 at % or more.

The transition metal may comprise at least any one among Cr, Ta, Ti, and Hf. The transition metal may comprise Cr.

The description of the transparent substrate disposed in the sputtering chamber is overlapped with the above description and thus omitted.

In the preparation, a magnet may be disposed in the sputtering chamber. The magnet may be disposed in the plane opposite to the one side where sputtering occurs within the sputtering target.

In the multilayer light shielding film formation operation, process conditions for sputtering may be applied differently to each thin film. In detail, in consideration of the surface roughness, chemical resistance, extinction characteristic, and etching characteristic, and the like required in each thin film, various process conditions such as the composition of an atmospheric gas, the pressure in a chamber, the electric power supplied to a sputtering target, the time for film formation, and the rotation speed of a substrate may be applied differently to each thin film.

The atmospheric gas may comprise an inert gas, a reactive gas, and a sputtering gas. The inert gas is a gas not comprising an element constituting the formed thin film. The reactive gas is a gas comprising an element constituting the formed thin film. The sputtering gas is a gas colliding with a target by ionization in a plasma atmosphere.

The inert gas may comprise helium

The reactive gas may comprise a gas comprising nitrogen elements. The gas comprising nitrogen elements may be for example, $N_2$, NO, $NO_2$, $N_2O$, $N_2O_3$, $N_2O_4$, $N_2O_5$ or the like. The reactive gas may comprise a gas comprising oxygen elements. The gas comprising oxygen elements may be for example, $O_2$, $CO_2$, or the like. The reactive gas may comprise a gas comprising nitrogen elements and a gas comprising oxygen elements. The reactive gas may comprise a gas comprising both nitrogen elements and oxygen elements. The gas comprising both nitrogen elements and oxygen elements may be for example, NO, $NO_2$, $N_2O$, $N_2O_3$, $N_2O_4$, $N_2O_5$, or the like.

The sputtering gas may be Ar gas.

A power source for supplying an electric power to the sputtering target may be DC power source, or RF power source.

In the first light shielding layer formation operation, an electric power of 1.5 kW to 2.5 kW may be supplied to a sputtering target. An electric power of 1.6 kW to 2 kW may be supplied to the sputtering target.

In the first light shielding layer formation process, the ratio of the flow rate of a reactive gas to the flow rate of an inert gas may be a value of 1.5 to 3. The ratio of flow rate may be a value of 1.8 to 2.7. The ratio of flow rate may be a value of 2 to 2.5.

In the atmospheric gas, the ratio of the oxygen amount to the nitrogen amount comprised in the reactive gas may be a value of 1.5 to 4. The ratio may be a value of 2 to 3. The ratio may be a value of 2.2 to 2.7.

In such a case, the first light shielding layer can help the multilayer light shielding film to have a sufficient extinction characteristic. Additionally, in the process of patterning the multilayer light shielding film, the first light shielding layer can help the shape of the multilayer light shielding pattern film to be controlled elaborately.

The formation of the first light shielding layer may be performed for a time of 200 second to 300 seconds. The formation of the first light shielding layer may be performed for a time of 200 seconds to 250 seconds. In such a case, it is possible to help the multilayer light shielding film to have a sufficient extinction characteristic.

After completion of the first light shielding film formation operation, the second light shielding film formation operation may be performed on the first light shielding film In the second light shielding film formation operation, an adhesion enhancing layer formation process may be performed first. The adhesion enhancing layer may be formed on the first light shielding film. The adhesion enhancing layer may be formed on the top side of the first light shielding film. The adhesion enhancing layer may be formed on the top side of another thin film disposed on the first light shielding film.

In the adhesion enhancing layer formation process, an electric power of 1.5 kW to 2.5 kW may be supplied to the sputtering target. The electric power may be applied to have a intensity of 1.6 kW to 2 kW.

In such a case, it is possible to help the surface roughness characteristic of the adhesion enhancing layer 221 to be controlled within a predetermined range in the embodiment.

The adhesion enhancing layer formation process may be performed after 15 seconds or more from the time when a thin film is completely formed to be disposed in contact with the bottom side of the adhesion enhancing layer (for example, the first light shielding layer). The adhesion enhancing layer formation process may be performed after 20 seconds or more from the time when a thin film is completely formed to be disposed in contact with the lower surface of the adhesion enhancing layer. The adhesion enhancing layer formation process may be performed within 30 seconds from the time when a thin film is completely formed to be disposed in contact with the bottom side of the adhesion enhancing layer.

The adhesion enhancing layer formation process may be performed after the atmospheric gas applied to the formation of a thin film (for example, the first light shielding layer) disposed in contact with the bottom side of the adhesion enhancing layer is completely exhausted from the sputtering chamber. The adhesion enhancing layer formation process may be performed within 10 seconds from the time when the atmospheric gas applied to the formation of a thin film disposed in contact with the bottom surface of the adhesion enhancing layer is completely exhausted. The adhesion enhancing layer formation process may be performed within 5 seconds from the time when the atmospheric gas applied to the formation of a thin film disposed in contact with the lower surface of the adhesion enhancing layer is completely exhausted.

In such a case, the composition of the adhesion enhancing layer can be further elaborately controlled.

In the adhesion enhancing layer formation process, the ratio of the flow rate of the reactive gas to the flow rate of the inert gas comprised in the atmospheric gas may be a value of 0.3 to 0.7. The ratio of the flow rate may be a value of 0.4 to 0.6.

The ratio of the oxygen amount to the nitrogen amount comprised in the reactive gas may be 0.3 or less. The ratio may be 0.1 or less. The ratio may be 0 or more.

In such a case, the difference in the surface energy between the first light shielding film and the adhesion enhancing layer can be controlled within a certain range, and the surface of the adhesion enhancing layer can be controlled to have a kurtosis value in the range predetermined in the present disclosure.

The formation of the adhesion enhancing layer may proceed for a time of 1 second to 15 seconds. The formation of the adhesion enhancing layer may proceed for a time of 2 seconds to 8 seconds.

In such a case, the thickness and the surface roughness characteristic of the adhesion enhancing layer can be controlled within a range predetermined in the embodiment.

The description of the surface roughness characteristic of the adhesion enhancing layer immediately after the formation of the adhesion enhancing layer is overlapped with the above description and thus omitted.

After the completion of the adhesion enhancing layer formation process, an upper light shielding layer formation process may be performed. The upper light shielding layer may be formed on the adhesion enhancing layer. The upper light shielding layer may be formed in contact with the top side of the adhesion enhancing layer. The upper light shielding layer may be formed in contact with the surface of another thin film disposed on the adhesion enhancing layer.

In the upper light shielding layer formation process, an electric power of 1 to 2 kW may be supplied to the sputtering target. The electric power may be applied to be intensity of 1.2 to 1.7 kW. In such a case, it is possible to help the second light shielding film to have desired optical properties and etching characteristics.

The upper light shielding layer formation process may be performed after 15 seconds or more from the time when a thin film (for example, the adhesion enhancing layer) is formed to be disposed in contact with the bottom side of the upper light shielding film. The upper light shielding layer formation process may be performed after 20 seconds or more from the time when a thin film is formed to be disposed in contact with the bottom side of the upper light shielding layer. The upper light shielding layer formation process may be performed within 30 seconds from the time when a thin film is formed to be disposed in contact with the bottom side of the upper light shielding film.

The upper light shielding layer formation process may be performed after the atmospheric gas applied to the formation of a thin film (for example, the adhesion enhancing layer) disposed in contact with the bottom side of the upper light shielding layer is completely exhausted from the sputtering chamber. The upper light shielding layer formation process may be performed within 10 seconds from the time when the atmospheric gas applied to the formation of a thin film disposed in contact with the lower surface of the upper light shielding layer is completely exhausted. The upper light shielding layer formation process may be performed within 5 seconds from the time when the atmospheric gas applied to the formation of a thin film disposed in contact with the bottom surface of the upper light shielding layer is completely exhausted.

In such a case, it is possible to control the composition of the upper light shielding layer further elaborately.

In the upper light shielding layer formation process, the ratio of the flow rate of the reactive gas to the flow rate of the inert gas comprised in the atmospheric gas may be a value of 0.3 to 0.7. The ratio of the flow rate may be a value of 0.4 to 0.6.

In the upper light shielding layer formation process, the ratio of the oxygen amount to the nitrogen amount comprised in the reactive gas may be 0.3 or less. The ratio may be 0.1 or less. The ratio may be 0 or more.

In such a case, it is possible to control the shape of the multilayer light shielding pattern film formed by patterning of the multilayer light shielding film further elaborately.

The formation of the upper light shielding layer may proceed for a time of 5 seconds to 40 seconds. The formation of the upper light shielding layer may proceed for a time of 10 seconds to 30 seconds. In such a case, when the multilayer light shielding pattern film is formed through dry etching, it is possible to control the shape of the multilayer light shielding pattern film further elaborately.

Manufacturing Method of Semiconductor Element

A manufacturing method of a semiconductor element according to another embodiment of the present application comprises a preparation of disposing a light source, a photomask, and a semiconductor wafer in which a resist film have been applied, an exposure operation of selectively transmitting a light incident from the light source on the semiconductor wafer through the photomask to be transferred and a development operation of developing a pattern on the semiconductor wafer.

The photomask comprises a transparent substrate and a multilayer light shielding pattern film disposed on the transparent substrate.

The multilayer light shielding pattern film comprises a transition metal, and at least any one between oxygen and nitrogen.

The multilayer light shielding pattern film comprises a first light shielding film and a second light shielding film disposed on the first light shielding film.

The multilayer light shielding pattern film comprises total nine parts of the multilayer light shielding pattern film that are formed by trisection in a width direction and a length direction of an upper surface of the transparent substrate.

Each part of the multilayer light shielding pattern film comprises a measuring range disposed in the side surface.

The measuring range is corresponded to a range between a point distant from an upper boundary of the first light shielding film to an lower boundary of the first light shielding film and a point distant from a lower boundary of the second light shielding film to a upper boundary of the second light shielding film.

The multilayer light shielding pattern film has pdR (difference value of roughness for a photomask) values of Equation 2 below respectively measured from the total nine parts of the multilayer light shielding pattern film, and an average value of pdR values of the Equation 2 is 3 nm or less.

$$pdR = pRac - pRbc \qquad \text{[Equation 2]}$$

The pRac is a surface roughness [unit: nm] measured from the measuring range after the multilayer light shielding pattern film is soaked for 800 second in SC-1 (Standard Clean-1) solution and rinsed by ozone water.

The pRbc is a surface roughness [unit: nm] measured from the measuring range before the multilayer light shielding pattern film is soaked in the SC-1 solution, the SC-1 solution is a solution comprising $NH_4OH$ of 14.3 wt %, $H_2O_2$ of 14.3 wt %, and $H_2O$ of 71.4 wt %, and the ozone water is a solution comprising ozone in an amount of 20 ppm (based on the weight) with ultrapure water as a solvent.

In the preparation, the light source is an apparatus which can generate an exposure light with a short wavelength. The exposure light may be a light with a wavelength of 200 nm or less. The exposure light may be ArF light with the wavelength of 193 nm.

A lens may be additionally disposed between the photomask and the semiconductor wafer. The lens has a function of miniaturing the shape of a circuit pattern on the photomask and transferring the pattern on the semiconductor wafer. The lens may be ordinary one applicable to an ArF exposure process of a semiconductor wafer and it is not limited in the type. For example, the lens may be a lens composed of calcium fluoride ($CaF_2$).

In the exposure operation, an exposure light may be selectively transmitted on the semiconductor wafer through the photomask. In such a case, chemical modification may occur in a portion to which an exposure light has been incident within a resist film.

In the development operation, the semiconductor wafer after the exposure operation is treated with a developing solution and thereby a pattern may be developed on the semiconductor wafer. When the applied resist film is a positive resist, a portion to which an exposure light has been incident within a resist film may be dissolved by a developing solution. When the applied resist film is a negative resist, a portion to which an exposure light is not incident may be dissolved by a developing solution. By the treatment with a developing solution, the resist film is formed into a resist pattern. By taking the resist pattern as a mask, a pattern may be formed on the semiconductor wafer.

The description of the photomask is overlapped with the above description and thus omitted.

Hereinafter, detailed embodiments will be described in further detail.

Manufacture Example: Formation of Multilayer Light Shielding Film

Example 1: A transparent substrate made from quartz in the size of 6-inched width, 6-inched length, and 0.25 inched thickness was disposed in a chamber of DC sputtering apparatus. A chrome target was disposed in the chamber to have the T/S distance of 255 mm and the angle of 25 degrees between the substrate and the target.

A first light shielding film is formed on the transparent substrate. In detail, the atmospheric gas mixed in the volume ratio of $Ar:N_2:CO_2=3:2:5$ was introduced in a chamber, the electric power of 1.85 kW was supplied to a sputtering target, the rotation speed of 10 RPM for the substrate was applied, and thereby a sputtering process proceeded for a time of 200 seconds to 250 seconds to form a lower light shielding layer.

After completion of the first light shielding film, the formation of a second light shielding film comprising an adhesion enhancing layer and an upper light shielding layer is performed. In detail, the atmospheric gas mixed in the volume ratio of $Ar:N_2=6.5:3.5$ was introduced in a chamber, the electric power of 1.85 kW was supplied to a sputtering target, the rotation speed of 10 RPM for the substrate was applied, a sputtering process proceeded for 5 seconds, and thereby an adhesion enhancing layer was formed on the first light shielding film. In the process of forming the adhesion enhancing layer, an electric power was supplied to the sputtering target after 20 seconds from the time when the formation of the first light shielding film had been completed, and the atmospheric gas was injected within 5 seconds from the time when the atmospheric gas applied to the formation of the first light shielding film had been exhausted completely from the chamber.

After completion of the formation of the adhesion enhancing layer, an atmospheric gas mixed in the volume ratio of $Ar:N_2=6.5:3.5$ was introduced in the chamber, the electric power of 1.5 kW was supplied to a sputtering target, the rotation speed of 10 RPM for the substrate was applied, and thereby a sputtering process was performed for a time of 10 seconds to 30 seconds on the top side of the adhesion enhancing layer to form an upper light shielding layer.

In the process of forming first and second light shielding films, the atmospheric gas was supplied through an inlet placed in the bottom side of the inner space of the sputtering chamber.

Example 2: A multilayer light shielding film was formed under the same condition as Example 1. However, in the adhesion enhancing layer formation process, an atmospheric gas mixed in the volume ratio of $Ar:N_2=7:3$ was introduced in the chamber, and the electric power of 1.83 kW was supplied to the sputtering target.

Example 3: A multilayer light shielding film was formed under the same condition as Example 1. However, in the process of forming the first light shielding film, the electric power of 1.86 kW was supplied to the sputtering target. In the process of forming the adhesion enhancing layer, the atmospheric gas mixed in the volume ratio of $Ar:N_2=7:3$ was introduced in the chamber, and the electric power of 1.87 kW was supplied to the sputtering target. In the process of forming the upper light shielding layer, the atmospheric gas mixed in the volume ratio of $Ar:N_2=7:3$ was introduced in the chamber, and the electric power of 1.55 kW was added to the sputtering target.

Comparative Example 1: A multilayer light shielding film was formed under the same condition as Example 1. However, in the process of forming the adhesion enhancing layer, the atmospheric gas mixed in the volume ratio of $ArN_2=5.5:4.5$ was introduced in the chamber, the electric power of 1 kW was added to the sputtering target, the rotation speed of 5 RPM for the substrate was applied, and the time of 8 seconds for forming the adhesion enhancing layer was applied.

Comparative Example 2: A multilayer light shielding film was formed under the same condition as Example 1. However, in the process of forming the adhesion enhancing layer, the atmospheric gas mixed in the volume ratio of $ArN_2=4.5:5.5$ was introduced in the chamber.

The condition for forming layers of each Example or Comparative Example was described in Table 1 below.

Evaluation Example: Thickness Measurement of Each Thin Film

TEM image of a sample of each Example or Comparative Example was measured and the thicknesses of the lower light shielding layer, the adhesion enhancing layer, and the second light shielding film. The method of measuring TEM image was applied by the same method as the method applied when the above dR value is measured.

The result of measurement of each Example or Comparative Example was described in Table 2 below.

Evaluation Example: Measurement of dR Value dR values were measured from respective parts of the multilayer light shielding film of Examples and Comparative Examples.

In detail, the sample of each Example or Comparative Example was respectively divided into three parts in the width and length directions and cut to form total nine parts of the blank mask having the size of 15 mm vertically and horizontally In detail, a blank mask sample as a measuring target was placed in a stage of X and Y axial cutting machine and fixed by Stop bar. After the sample is fixed, in consideration of the position to be cut within the sample, a cutting wheel is moved and fixed. After the cutting wheel is fixed, the cutting wheel is moved in reciprocating motion at the speed of 0.15 m/s for the upper end of the sample and the sample is cut and processed.

The X and Y axial cutting machine was applied by SPC-452 model available from KStar Co., Ltd.

The processed part of the blank mask was treated by FIB (Focused Ion Beam). Subsequently, the sectional image of the processed part of the blank mask was measured through JEM-2100F HR model apparatus available from JEOL LTD.

After elevating contrate of the sectional image of the part of the blank mask, the measuring range was specified from the image. A point distant by 5 nm from the interface of the first light shielding film 21 and the second light shielding film to the lower boundary of the first light shielding film 21 and a point distant by 5 nm from the interface to the upper boundary of the second light shielding film 22 was specified as the measuring range.

Thereafter, the surface profile of the portion corresponded to the measuring range within the side surface of the part of the multilayer light shielding film was traced, and from the traced line, an Rbc value was calculated in accordance with the method of calculating Ry (the maximum height roughness) standardized in ISO 4287.

After the measurement of the Rbc value, the processed part of the blank mask was soaked for 800 seconds in SC-1 solution, and rinsed by use of ozone water. Soaking in SC-1 solution and rinsing by use of ozone water were performed at a room temperature.

Thereafter, the same method as the method of measuring Rbc value was applied to measure Rac value.

In the same way as the above, dR values were measured from the total nine parts of the multilayer light shielding film of Examples and Comparative Examples. After that, the average value and the standard deviation value of the dR values were calculated.

The average value and the standard deviation value of dR values of Examples and Comparative Examples were described in Table 2 below, and the dR values measured by parts of the blank mask were described in Table 3.

Evaluation Example: Measurement of Rku Value of Surface of Adhesion Enhancing Layer Immediately After Being Formed During the manufacturing process of samples of Examples and Comparative Examples, Rku values by sector surfaces of the adhesion enhancing layer were measured immediately after the adhesion enhancing layer had been formed.

In detail, total nine sectors of the adhesion enhancing layer that were formed by trisection in a width direction and a length direction were specified. Rku values were measured by use of a two-dimensional roughness meter in the area of 20 μm vertically and horizontally located at the center of the surface of the sector of the adhesion enhancing layer. The scan speed was set to be 0.5 Hz, and Non-contact mode was applied. As for the two-dimensional roughness meter, XE-150 model available from Park System applied with PPP-NCHR as Cantilever model available from Park System was used. From the Rku values measured by sectors of the adhesion enhancing layer, the average value and the standard deviation value of the Rku values were calculated.

The result of the measurement of the average value and the standard deviation of Rku values of each Example or Comparative Example was described in Table 2 below, and the measured values for Rku by sectors of the adhesion enhancing layer immediately after being formed were described in Table 4.

Evaluation Example: Measurement of Optical Properties

By using a spectroscopic ellipsometer of MG-Pro model available from Nano-View Co., Ltd, measurement for the optical density and transmittance with respect to a light with the wavelength of 193 nm of a sample of each Example or Comparative Example was made.

In detail, from the surface of the light shielding film of a sample of each Example or Comparative Example, a measuring range of 146 mm vertically and horizontally located at the center of the light shielding film was specified. The measuring range was divided into six sections in the width direction and the length direction and thereby total 36 sectors formed in this manner were specified. Total 49 vertices of the respective sectors were specified as measuring points, and the transmittance values were measured by use of a spectroscopic ellipsometer at the measuring points. The average value of the transmittance values by measuring points were calculated, and the value was taken as a transmittance value of a sample of each Example or Comparative Example. An optical density was calculated from the calculated transmittance value.

The result of measurement of each Example or Comparative example was described in Table 5 below.

Evaluation Example: Measurement of Composition by Thin Films

The amounts by elements of each layer or each film of each Example of Comparative Example were measured by use of XPS analysis. In detail, a blank mask of each Example of Comparative Example was cut into the size having the width of 15 mm and the length of 15 mm. After the sample was disposed in a measuring apparatus of K-Alpha model available from Thermo Scientific, an area having the width of 4 mm and the length of 2 mm was etched and the amounts by elements of each layer or each film were measured.

The result of measurement of each Example or Comparative Example was described in Table 6 below.

TABLE 1

| | Type of Film/Layer | Electric Power for Sputtering (kW) | Rotation Speed of Substrate (RPM) | Time for Forming Layers (Sec) | Composition of Atmospheric Gas (Volume Ratio) |
|---|---|---|---|---|---|
| Example 1 | Upper Light shielding Layer | 1.5 | 10 | 10~30 | Ar:$N_2$ = 6.5:3.5 |
| | Adhesion Enhancing Layer | 1.85 | 10 | 5 | Ar:$N_2$ = 6.5:3.5 |
| | First Light shielding Film | 1.85 | 10 | 200~250 | Ar:$N_2$:$CO_2$ = 3:2:5 |

TABLE 1-continued

| | Type of Film/Layer | Electric Power for Sputtering (kW) | Rotation Speed of Substrate (RPM) | Time for Forming Layers (Sec) | Composition of Atmospheric Gas (Volume Ratio) |
|---|---|---|---|---|---|
| Example 2 | Upper Light shielding Layer | 1.5 | 10 | 10~30 | $Ar:N_2 = 6.5:3.5$ |
| | Adhesion Enhancing Layer | 1.83 | 10 | 5 | $Ar:N_2 = 7:3$ |
| | First Light shielding Film | 1.85 | 10 | 200~250 | $Ar:N_2:CO_2 = 3:2:5$ |
| Example 3 | Upper Light shielding Layer | 1.55 | 10 | 10~30 | $Ar:N_2 = 7:3$ |
| | Adhesion Enhancing Layer | 1.87 | 10 | 5 | $Ar:N_2 = 7:3$ |
| | First Light shielding Film | 1.86 | 10 | 200~250 | $Ar:N_2:CO_2 = 3:2:5$ |
| Comparative Example 1 | Upper Light shielding Layer | 1.5 | 10 | 10~30 | $Ar:N_2 = 6.5:3.5$ |
| | Adhesion Enhancing Layer | 1 | 5 | 8 | $Ar:N_2 = 5.5:4.5$ |
| | First Light shielding Film | 1.85 | 10 | 200~250 | $Ar:N_2:CO_2 = 3:2:5$ |
| Comparative Example 2 | Upper Light shielding Layer | 1.5 | 10 | 10~30 | $Ar:N_2 = 6.5:3.5$ |
| | Adhesion Enhancing Layer | 1.85 | 10 | 5 | $Ar:N_2 = 4.5:5.5$ |
| | First Light shielding Film | 1.85 | 10 | 200~250 | $Ar:N_2:CO_2 = 3:2:5$ |

TABLE 2

| | Type of Film/Layer | Thickness (Å) | Average dR Value (nm) | Standard Deviation of dR (nm) | Average Rku Values by Sectors of Adhesion Enhancing Layer | Standard Deviation of Rku by Sectors of Adhesion Enhancing Layer |
|---|---|---|---|---|---|---|
| Example 1 | Upper Light shielding Layer | 60 | 0.98 | 0.47 | 8.87 | 1.57 |
| | Adhesion Enhancing Layer | 15 | | | | |
| | First Light shielding Film | 460 | | | | |
| Example 2 | Upper Light shielding Layer | 60 | 1.11 | 0.43 | 6.69 | 0.60 |
| | Adhesion Enhancing Layer | 15 | | | | |
| | First Light shielding Film | 460 | | | | |
| Example 3 | Upper Light shielding Layer | 60 | 1.35 | 0.31 | 7.84 | 1.00 |
| | Adhesion Enhancing Layer | 17 | | | | |
| | First Light shielding Film | 460 | | | | |
| Comparative Example 1 | Upper Light shielding Layer | 60 | 3.76 | 0.63 | 3.20 | 0.67 |
| | Adhesion Enhancing Layer | 10 | | | | |
| | First Light shielding Film | 460 | | | | |
| Comparative Example 2 | Upper Light shielding Layer | 60 | 4.14 | 0.42 | 3.03 | 0.67 |
| | Adhesion Enhancing Layer | 11 | | | | |
| | First Light shielding Film | 460 | | | | |

40

TABLE 3 dR Values (nm) Meausred by Parts of Blank Mask

| | Part 1 | Part 2 | Part 3 | Part 4 | Part 5 | Part 6 | Part 7 | Part 8 | Part 9 |
|---|---|---|---|---|---|---|---|---|---|
| Example 1 | 0.30 | 1.30 | 0.80 | 1.60 | 0.50 | 0.50 | 1.30 | 1.40 | 1.10 |
| Example 2 | 0.72 | 0.61 | 0.87 | 1.75 | 0.98 | 1.10 | 1.88 | 0.97 | 1.14 |
| Example 3 | 1.30 | 1.70 | 1.42 | 0.70 | 1.10 | 1.35 | 1.55 | 1.70 | 1.30 |
| Comparative Example 1 | 3.08 | 3.51 | 3.81 | 4.26 | 4.49 | 3.21 | 3.66 | 4.78 | 3.06 |
| Comparative Example 2 | 4.11 | 4.25 | 4.14 | 3.99 | 5.2 | 4.01 | 3.83 | 3.78 | 3.95 |

TABLE 4

Rku Values by Sectors of Adhesion Enhancing Layer Sector immediately after forming

| | Sector 1 | Sector 2 | Sector 3 | Sector 4 | Sector 5 | Sector 6 | Sector 7 | Sector 8 | Sector 9 |
|---|---|---|---|---|---|---|---|---|---|
| Example 1 | 11.89 | 8.61 | 9.11 | 7.15 | 9.20 | 10.41 | 7.35 | 7.21 | 8.92 |
| Example 2 | 7.36 | 7.81 | 6.93 | 6.14 | 6.38 | 6.35 | 6.00 | 6.89 | 6.34 |
| Example 3 | 8.02 | 6.68 | 7.62 | 9.63 | 8.90 | 7.79 | 7.05 | 6.64 | 8.21 |

TABLE 4-continued

| | Rku Values by Sectors of Adhesion Enhancing Layer Sector immediately after forming | | | | | | | | |
|---|---|---|---|---|---|---|---|---|---|
| | Sector 1 | Sector 2 | Sector 3 | Sector 4 | Sector 5 | Sector 6 | Sector 7 | Sector 8 | Sector 9 |
| Comparative Example 1 | 4.00 | 3.52 | 2.66 | 2.56 | 2.50 | 3.67 | 3.26 | 2.49 | 4.17 |
| Comparative Example 2 | 2.51 | 2.41 | 2.45 | 3.35 | 2.20 | 2.95 | 3.79 | 3.92 | 3.71 |

TABLE 5

| | Transmittance (%) | Optical Density |
|---|---|---|
| Example 1 | 1.01 | 1.96 |
| Example 2 | 0.93 | 2.03 |
| Example 3 | 0.86 | 2.06 |
| Comparative Example 1 | 1.9 | 1.72 |
| Comparative Example 2 | 1.45 | 1.84 |

TABLE 6

| | | Element Amount (at %) | | | |
|---|---|---|---|---|---|
| | Type of Layer/Film | Cr | O | C | N |
| Example 1 | Upper Light shielding Layer | 67 | 10 | 3 | 20 |
| | Adhesion Enhancing Layer | 70 | 10 | 3 | 18 |
| | First Light shielding Film | 43 | 38 | 9 | 10 |
| Example 2 | Upper Light shielding Layer | 67 | 10 | 3 | 20 |
| | Adhesion Enhancing Layer | 67 | 10 | 3 | 20 |
| | First Light shielding Film | 43 | 38 | 9 | 10 |
| Example 3 | Upper Light shielding Layer | 67 | 10 | 3 | 20 |
| | Adhesion Enhancing Layer | 67 | 10 | 3 | 20 |
| | First Light shielding Film | 43 | 38 | 9 | 10 |
| Comparative Example 1 | Upper Light shielding Layer | 67 | 10 | 3 | 20 |
| | Adhesion Enhancing Layer | 52 | 20 | 5 | 23 |
| | First Light shielding Film | 43 | 38 | 9 | 10 |
| Comparative Example 2 | Upper Light shielding Layer | 67 | 10 | 3 | 20 |
| | Adhesion Enhancing Layer | 48 | 21 | 4 | 27 |
| | First Light shielding Film | 43 | 38 | 9 | 10 |

In the Table 2, while the average value of dR values of Examples 1 to 3 was 1 nm or less as measured, the average value of dR values of Comparative Examples 1 and 2 was 3.5 nm or more as measured.

For the standard deviation of dR values, while Examples 1 to 3 and Comparative Example 2 had a standard deviation of dR values of 0.5 nm or less as measured, Comparative Example 1 had a value of more than 0.5 nm as measured.

For the average value of Rsk values by sectors of the adhesion enhancing layer, while Examples 1 to 3 were 7 or more as measured, Comparative Examples 1 and 2 were less than 3.5 as measured.

For the standard deviation of Rsk values by sectors of the adhesion enhancing layer, all Examples and Comparative Examples were 2 or less as measured.

In the table 5, all the Examples and Comparative Examples had a transmittance of 1.5% or less as measured.

For the optical density, all the Examples and Comparative Examples had a value of 1.7 or more as measured.

Although the exemplary embodiments have been described in detail, the scope of the present invention is not limited thereto, and modifications and alterations made by those skilled in the art using the basic concept of the present invention defined in the following claims fall within the scope of the present invention.

What is claimed is:

1. A blank mask comprising a transparent substrate and a multilayer light shielding film disposed on the transparent substrate, wherein the multilayer light shielding film comprises chromium (Cr) and at least one of oxygen (O) and nitrogen (N), wherein the multilayer light shielding film comprises a first light shielding film and a second light shielding film disposed on the first light shielding film, wherein the first light shielding film comprises chromium (Cr) in an amount of 25 atomic percent (at %) to 50 at %, wherein the second light shielding film comprises chromium (Cr) in an amount of 55 at % to 70 at %, wherein the multilayer light shielding film has an optical density of 1.8 or more with respect to a light with the wavelength of 193 nm, wherein the second light shielding film comprises an upper light shielding layer and an adhesion enhancing layer disposed between the upper light shielding layer and the first light shielding film, and wherein the adhesion enhancing layer has a thickness of 12 Å to 30 Å, wherein the adhesion enhancing layer is a distinct layer having a first interface with the first light shielding film and a second interface with the upper light shielding layer, and wherein a composition of the adhesion enhancing layer is substantially uniform across the thickness of the adhesion enhancing layer and different from the compositions of the first light shielding film and the upper light shielding layer, wherein an absolute value of a difference between the amount of chromium in the adhesion enhancing layer and the amount of chromium in the upper light shielding layer is 10 at % or less, wherein the multilayer light shielding film comprises a total of nine parts formed by trisection in a width direction and a length direction of an upper surface of the multilayer light shielding film, wherein each part of the multilayer light shielding film comprises a measuring range disposed on a side thereof, wherein the measuring range corresponds to a range between a point distant from an upper boundary of the first light shielding film to a lower boundary of the first light shielding film and a point distant from a lower boundary of the second light shielding film to an upper boundary of the second light shielding film, and wherein the multilayer light shielding film has dR (difference in roughness) values of Equation 1 measured from the total nine parts of the multilayer light shielding film, and an average value of the dR values is 3 nm or less:

$$dR=Rac-Rbc \quad \text{[Equation 1]}$$

wherein Rac is a surface roughness [unit: nm] measured from the measuring range of the part of the multilayer light shielding film after soaking the part for 800 seconds in SC-1 (Standard Clean-1) solution and rinsing with ozone water, wherein Rbc is a surface roughness [unit: nm] measured from the measuring range of the part of the multilayer light shielding before soaking in SC-1 solution, wherein the SC-1 solution comprises $NH_4OH$ (14.3 wt %), $H_2O_2$ (14.3 wt %), and $H_2O$ (71.4 wt %), and wherein the ozone water comprises ozone at 20 ppm in ultrapure water.

2. The blank mask of claim 1, wherein a standard deviation of dR values respectively measured from the total nine parts of the multilayer light shielding film is 0.5 nm or less.

3. The blank mask of claim 1, comprising an interface, wherein the interface is disposed between the upper boundary of the first light shielding film and the lower boundary of the second light shielding film, wherein the measuring range is corresponded to a range between a point distant by 5 nm from the interface to the lower boundary of the first light shielding film and a point distant by 5 nm from the interface to the upper boundary of the second light shielding film.

4. The blank mask of claim 1, wherein the adhesion enhancing layer has a thickness of 12 Å to 30 Å.

5. The blank mask of claim 1, wherein an absolute value of a value of subtracting an amount of chromium of the first light shielding film from an amount of chromium of the adhesion enhancing layer is 35 at % or less.

6. The blank mask of claim 1, wherein an upper surface of the adhesion enhancing layer immediately after forming comprises total nine sectors that are formed by trisection in a width direction and a length direction of the upper surface of the adhesion enhancing layer, and wherein the adhesion enhancing layer has Rku (kurtosis) values respectively measured from the total nine sectors of the adhesion enhancing layer, and an average value of the Rku values is 3.5 or more.

7. The blank mask of claim 6, wherein a standard deviation of the Rku values respectively measured from the total nine sectors of the adhesion enhancing layer is 2 or less.

8. A photomask comprising:

a transparent substrate and a multilayer light shielding pattern film disposed on the transparent substrate, wherein the multilayer light shielding pattern film comprises chromium (Cr) and at least one of oxygen (O) and nitrogen (N), wherein the multilayer light shielding pattern film comprises a first light shielding film and a second light shielding film disposed on the first light shielding film, wherein the first light shielding film comprises chromium (Cr) in an amount of 25 atomic percent (at %) to 50 at %, wherein the second light shielding film comprises chromium (Cr) in an amount of 55 at % to 70 at %, wherein the multilayer light shielding film has an optical density of 1.8 or more with respect to a light with the wavelength of 193 nm, wherein the second light shielding film comprises an upper light shielding layer and an adhesion enhancing layer disposed between the upper light shielding layer and the first light shielding film, and wherein the adhesion enhancing layer has a thickness of 12 Å to 30 Å, wherein the adhesion enhancing layer is a distinct layer having a first interface with the first light shielding film and a second interface with the upper light shielding layer, and wherein a composition of the adhesion enhancing layer is substantially uniform across the thickness of the adhesion enhancing layer and different from the compositions of the first light shielding film and the upper light shielding layer, wherein an absolute value of a difference between the amount of chromium in the adhesion enhancing layer and the amount of chromium in the upper light shielding layer is 10 at % or less, wherein the multilayer light shielding pattern film comprises a total nine parts formed by trisection in a width direction and a length direction of an upper surface of the transparent substrate, wherein each part of the multilayer light shielding pattern film comprises a measuring range disposed on a side thereof, wherein the measuring range corresponds to a range between a point distant from an upper boundary of the first light shielding film to a lower boundary of the first light shielding film and a point distant from a lower boundary of the second light shielding film to an upper boundary of the second light shielding film, and wherein the multilayer light shielding pattern film has pdR (difference value of roughness for a photomask) values of Equation 2 measured from the total nine parts of the multilayer light shielding pattern film, and an average value of the pdR values is 3 nm or less:

$$pdR=pRac-pRb \quad \text{[Equation 2]}$$

wherein pRac is a surface roughness [unit: nm] measured from the measuring range of the multilayer light shielding pattern film after soaking the multilayer light shielding pattern film for 800 second in SC-1 solution and rinsing with ozone water, wherein pRbc is a surface roughness [unit: nm] measured from the measuring range of the part of the multilayer light shielding pattern film before soaking in SC-1 solution, wherein the SC-1 solution comprises $NH_4OH$ (14.3 wt %), $H_2O_2$ (14.3 wt %), and $H_2O$ (71.4 wt %), and wherein the ozone water comprises ozone at 20 ppm in ultrapure water.

9. A method of manufacturing a semiconductor element, the method comprising:

preparing a light source, a photomask, and a semiconductor wafer with a resist film applied;

exposing the semiconductor wafer by selectively transmitting light from the light source to the semiconductor wafer through the photomask; and developing a pattern on the semiconductor wafer, wherein the photomask comprises a transparent substrate and a multilayer light shielding pattern film disposed on the transparent substrate, wherein the multilayer light shielding pattern film comprises chromium (Cr) and at least one of oxygen (O) and nitrogen (N), wherein the multilayer light shielding pattern film comprises a first light shielding film and a second light shielding film disposed on the first light shielding film, wherein the first light shielding film comprises chromium (Cr) in an amount of 25 atomic percent (at %) to 50 at %, wherein the second light shielding film comprises chromium (Cr) in an amount of 55 at % to 70 at %, wherein the multilayer light shielding film has an optical density of 1.8 or more with respect to light of wavelength 193 nm, wherein the second light shielding film comprises an upper light shielding layer and an adhesion enhancing layer disposed between the upper light shielding layer and the first light shielding film, and wherein the adhesion enhancing layer has a thickness of 12 Å to 30 Å, wherein the adhesion enhancing layer is a distinct layer having a first interface with the first light shielding film and a second interface with the upper light shielding layer, and wherein a composition of the adhesion enhancing layer is substantially uniform across the thickness of the adhesion enhancing layer and different from the compositions of the first light shielding film and the upper light shielding layer, wherein an absolute value of a difference between the amount of chromium in the adhesion enhancing layer and the amount of chromium in the upper light shielding layer is 10 at % or less, wherein the multilayer light shielding pattern film comprises a total of nine parts formed by trisection in a width direction and a length direction of an upper surface of the transparent substrate, and wherein each part of the multilayer light shielding pattern film comprises a measuring range disposed on a side thereof, wherein the measuring range corresponds to a range between a point distant from an upper boundary of the first light shielding film to a lower boundary of the first light shielding film and a point distant from a lower boundary of the second light shielding film to an upper boundary of the second light shielding film, and wherein the multilayer light shielding pattern film has pdR (difference in roughness for a photomask) values of Equation 2 measured from the total nine parts of the multilayer light shielding pattern film, and an average value of the pdR values is 3 nm or less:

$$pdR = pRac - pRbc \qquad \text{[Equation 2]}$$

wherein pRac is a surface roughness [unit: nm] measured from the measuring range of the part of the multilayer light shielding pattern film after soaking the multilayer light shielding pattern film for 800 second in SC-1 solution and rinsing with ozone water, wherein pRbc is a surface roughness [unit: nm] measured from the measuring range of the part of the multilayer light shielding pattern film before soaking in SC-1 solution, wherein the SC-1 solution comprises $NH_4OH$ (14.3 wt %), $H_2O_2$ (14.3 wt %), and $H_2O$ (71.4 wt %), and wherein the ozone water comprises ozone at 20 ppm in ultrapure water.

* * * * *